(12) United States Patent
Lai et al.

(10) Patent No.: US 12,543,363 B2
(45) Date of Patent: Feb. 3, 2026

(54) HIGH ELECTRON MOBILITY TRANSISTOR AND HIGH ELECTRON MOBILITY TRANSISTOR FORMING METHOD

(71) Applicant: HiPer Semiconductor Inc., Grand Cayman (KY)

(72) Inventors: Yan Lai, Zhubei (TW); Wei-Chen Yang, Zhubei (TW)

(73) Assignee: HIPER SEMICONDUCTOR INC., George Town (KY)

( * ) Notice: Subject to any disclaimer, the term of this patent is extended or adjusted under 35 U.S.C. 154(b) by 92 days.

(21) Appl. No.: 18/466,434

(22) Filed: Sep. 13, 2023

(65) Prior Publication Data

US 2024/0213334 A1  Jun. 27, 2024

Related U.S. Application Data

(62) Division of application No. 18/069,367, filed on Dec. 21, 2022, now Pat. No. 11,799,000.

(51) Int. Cl.
| | | |
|---|---|---|
| *H10D 64/00* | (2025.01) | |
| *H01L 21/56* | (2006.01) | |
| *H01L 23/31* | (2006.01) | |
| *H10D 30/01* | (2025.01) | |
| *H10D 30/47* | (2025.01) | |
| *H10D 62/85* | (2025.01) | |
| *H10D 64/01* | (2025.01) | |

(52) U.S. Cl.
CPC .......... *H10D 64/118* (2025.01); *H01L 21/56* (2013.01); *H01L 23/3171* (2013.01); *H01L 23/3192* (2013.01); *H10D 30/015* (2025.01); *H10D 30/47* (2025.01); *H10D 30/475* (2025.01); *H10D 62/8503* (2025.01); *H10D 64/01* (2025.01)

(58) Field of Classification Search
CPC .... H10D 30/015; H10D 30/47; H10D 30/475; H10D 62/8503; H10D 64/118; H01L 21/56; H01L 23/3171; H01L 23/3192
See application file for complete search history.

(56) References Cited

U.S. PATENT DOCUMENTS

| | | |
|---|---|---|
| 8,803,158 B1 | 8/2014 | Chiu et al. |
| 8,937,336 B2 | 1/2015 | Chen et al. |
| 9,685,525 B2 | 6/2017 | Chiu et al. |
| 2006/0273347 A1 | 12/2006 | Hikita et al. |
| 2009/0321787 A1 | 12/2009 | Murphy et al. |
| 2013/0200389 A1 | 8/2013 | Lee |
| 2014/0335666 A1 | 11/2014 | Koehler et al. |

(Continued)

*Primary Examiner* — Joseph C. Nicely
(74) *Attorney, Agent, or Firm* — MUNCY, GEISSLER, OLDS & LOWE, P.C.

(57) ABSTRACT

A high electron mobility transistor (HEMT) and method for forming the same are disclosed. The high electron mobility transistor has a GaN epi-layer, a source ohmic contact, a drain ohmic contact, a gate structure, a first metal electrode contact and a first passivation layer. The source ohmic contact and the drain ohmic contact are disposed on the epi-layer. The gate structure is disposed on the epi-layer and between the source ohmic contact and the drain ohmic contact. The first metal electrode contact is disposed above the gate structure. The first passivation layer is sandwiched between the first metal electrode contact and the gate structure.

8 Claims, 19 Drawing Sheets

(56) References Cited

U.S. PATENT DOCUMENTS

| | | |
|---|---|---|
| 2015/0061038 A1* | 3/2015 | Takewaki ............ H10D 64/118 |
| | | 257/401 |
| 2015/0129973 A1 | 5/2015 | Ji et al. |
| 2015/0144953 A1* | 5/2015 | Hill ..................... H10D 30/015 |
| | | 438/172 |
| 2017/0294532 A1* | 10/2017 | Kudymov .......... H10D 62/8503 |
| 2020/0044067 A1 | 2/2020 | Banerjee et al. |
| 2020/0335617 A1* | 10/2020 | Banerjee ............ H10D 62/8503 |
| 2022/0005806 A1 | 1/2022 | Zhao et al. |
| 2022/0328676 A1 | 10/2022 | Chou et al. |
| 2022/0367698 A1 | 11/2022 | Hwang et al. |
| 2023/0095367 A1 | 3/2023 | Zhao et al. |

* cited by examiner

HIGH ELECTRON MOBILITY TRANSISTOR AND HIGH ELECTRON MOBILITY TRANSISTOR FORMING METHOD

CROSS REFERENCE TO RELATED APPLICATIONS

This application is a Divisional of co-pending application Ser. No. 18/069,367, filed on Dec. 21, 2022, for which priority is claimed under 35 U.S.C. § 120, the entire contents of all of which are hereby incorporated by reference.

BACKGROUND

1. Technical Field

The present disclosure is related a high electron mobility transistor (HEMT) and a high electron mobility transistor forming method, specifically to an enhancement mode of a high electron mobility transistor and a method forming the same.

2. Description of the Related Art

Enhancement-mode (E-mode) high electron mobility transistors (HEMT) with a p-type doped GaN layer are the most commercially available high electron mobility transistors. However, gate reliability and surface trapping induced current collapse are the two major concerns affecting the reliability of these e-mode GaN high electron mobility transistors, especially those applied in high voltage applications. Approaches such as U.S. Pat. Nos. 8,937,336 and 9,685,525 are different passivation techniques to minimize surface trapping and device leakage. However, those prior arts neglect the-issues with the interface between the gate metal and p-type GaN of E-mode high electron mobility transistors. As a result, the interface between the gate metal and p-type GaN is a weak point allowing early onset of gate degradation.

SUMMARY

It is an object of the present invention to provide a high electron mobility transistor comprising a first passivation layer sandwiched between the first metal electrode contact and the gate structure to improve the gate reliability and surface trapping of the high electron mobility transistor at the same time.

It is another object of the present invention to provide a high electron mobility transistor forming method of sandwiching a first passivation layer between the first metal electrode contact and the gate structure to improve the gate reliability and surface trapping of the high electron mobility transistor at the same time.

To achieve the above objectives, the present disclosure provides a high electron mobility transistor including a GaN epi-layer, a source ohmic contact, a drain ohmic contact, a gate structure, a first metal electrode contact and a first passivation layer. The source ohmic contact and the drain ohmic contact are disposed on the GaN epi-layer. The gate structure is disposed on the GaN epi-layer and between the source ohmic contact and the drain ohmic contact. The first metal electrode contact is disposed above the gate structure. The first passivation layer is sandwiched between the first metal electrode contact and the gate structure.

To achieve the above objectives, the present disclosure further provides a high electron mobility transistor forming method including the following steps: forming a gate layer on a GaN epi-layer; etching the gate layer to form a gate structure; depositing a first passivation layer covering the GaN epi-layer and the gate layer; and depositing a first metal electrode contact to sandwich the first passivation layer between the first metal electrode contact and the gate structure.

To achieve the above objective, the present disclosure further provides a high electron mobility transistor forming method including the following steps: forming a gate layer on a GaN epi-layer; depositing an first passivation layer on the gate layer; depositing a first metal electrode contact layer on the passivation layer; etching the first metal electrode contact layer, the first passivation layer and the gate layer to define a gate structure and a first metal electrode contact, wherein the first passivation layer sandwiched between the first metal electrode contact and the gate structure remains intact; and depositing a first passivation layer covering the GaN epi-layer, the first metal electrode contact and the gate structure.

The present disclosure provides high electron mobility transistor (HEMT) and a high electron mobility transistor forming method comprising a first passivation layer sandwiched between the first metal electrode contact and the gate structure. Materials having ultra-wide bandgap and high-k properties such as AlN, InAlN and AlGaN, $SiO_2$, $Al_2O_3$, SiN, $HfO_2$, $TiO_2$, or $Ga_2O_3$, or a combination of the two of the above-mentioned materials with one material deposited on top of the other one are applied as the first passivation layer, so the first passivation layer provides an extra barrier between gate metal and p-type GaN for electron trapping and hole injection to improve the gate reliability of the high electron mobility transistor at the same time. When the first passivation layer of the present disclosure is on top of the barrier layer of the GaN epi layer, it also minimizes electron trapping in the surface passivation and therefore suppresses current collapse.

DETAILED DESCRIPTION OF THE EMBODIMENTS

In order to make the structure and characteristics as well as the effectiveness of the present disclosure further understood and recognized, a detailed description of the present disclosure is provided as follows, along with embodiments and accompanying figures.

Figure 1A:
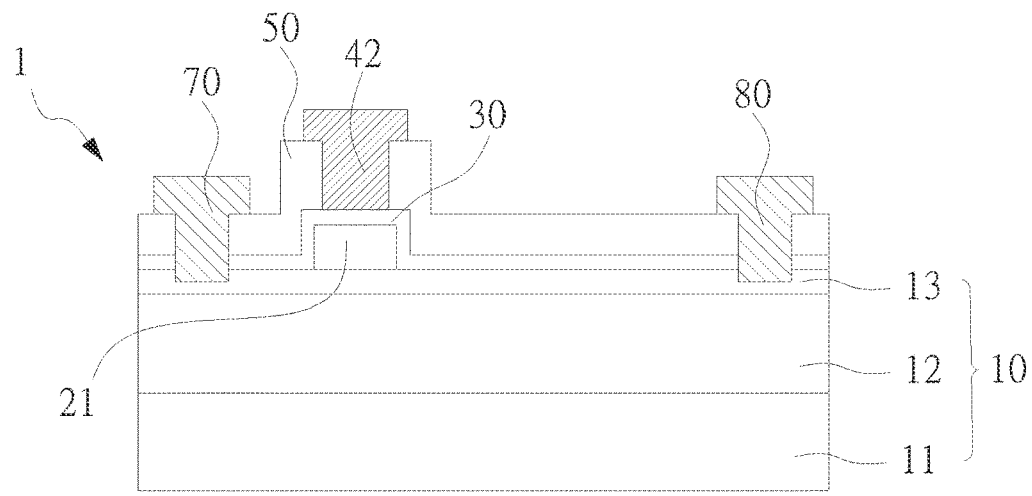
FIG. 1A illustrates a schematic diagram of a first embodiment of a high electron mobility transistor of the present disclosure.
Figure 1B:
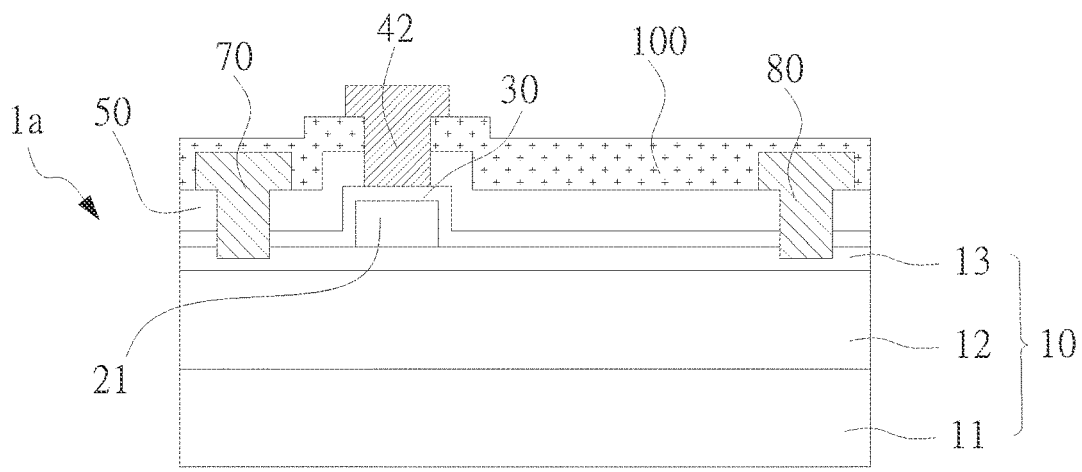
FIG. 1B illustrates a schematic diagram of a second embodiment of a high electron mobility transistor of the present disclosure.
Figure 1C:
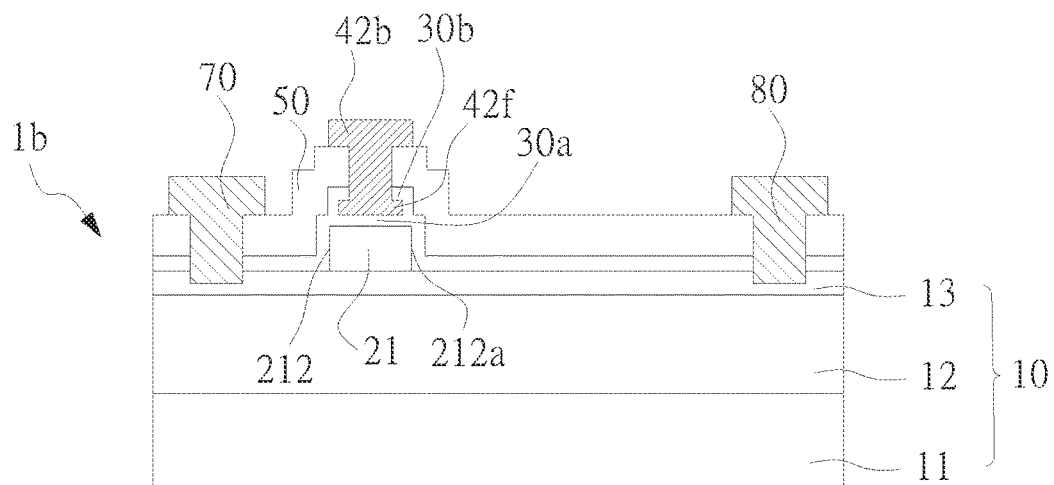
FIG. 1C illustrates a schematic diagram of a third embodiment of a high electron mobility transistor of the present disclosure.

Please refer to FIG. 1A to FIG. 1C, which present schematic diagrams of a first embodiment, a second embodiment, and a third embodiment of a high electron mobility transistor of the present disclosure.

As shown in FIG. 1A, according to the first embodiment of a high electron mobility transistor 1 (HEMT), the high electron mobility transistor 1 has a GaN epi-layer 10, a gate structure 21, a first passivation layer 30, a first metal electrode contact 42, a source ohmic contact 70, and a drain ohmic contact 80. The gate structure 21, the source ohmic contact 70 and the drain ohmic contact 80 are all disposed on the GaN epi-layer 10 and the gate structure 21 located between the source ohmic contact 70 and the drain ohmic contact 80. The first metal electrode contact 42 is disposed above the gate structure 21, the first passivation layer 30 sandwiched between the first metal electrode contact 42 and the gate structure 21.

According to one embodiment of the present disclosure, the high electron mobility transistor 1 is an enhancement-mode (E-mode) high electron mobility transistor and the GaN epi-layer 10 includes a substrate 11, a GaN buffer layer 12, and a barrier layer 13. The GaN buffer layer 12 is disposed between the substrate 11 and the barrier layer 12. The gate structure 21, the source ohmic contact 70 and the drain ohmic contact 80 are all disposed on the barrier layer 13. According to one embodiment of the present disclosure, the substrate 11 can be made of silicon, sapphire, SiC or other more complex materials such as SOI (Silicon On Insulator) or QST substrate; the GaN buffer 12 can be made of a GaN layer on top of a graded $Al_xGa_{1-x}N$ or AlN/GaN supper lattice; and the barrier layer 13 is made of $Al_yGa_{1-y}N$.

As shown in FIG. 1A, the gate structure 21 is a p-type GaN structure and the first passivation layer 30 is an AlN layer. However, the present application is not limited to this embodiment, for the gate structure 21 can also be an n-type GaN structure, an InGaN structure, or an AlGaN structure; the first passivation layer 30 can also be a thin (thickness less than 10 nm) InAlN layer, an AlGaN layer, or a high K dielectric material such as a $SiO_2$ layer, an $Al_2O_3$ layer, a SiN layer, a $HfO_2$ layer, a $TiO_2$ layer, or a $Ga_2O_3$ layer as well, or a combination of two of the above-mentioned materials, with a first layer of one material deposited on the GaN epi and the second layer consisted of a different material deposited on top of the first layer. In other words, according to an embodiment of the present disclosure, the first passivation layer 30 can be a two-layer combination made of an AlN layer situated on a SiN layer to perform a good material quality while the first passivation layer 30 is forming. It is noted that the thickness of the first passivation layer 30 sandwiched between the first metal electrode contact 42 and the gate structure 21 is less than 10 nm to ensure that the electrical behavior between the first metal electrode contact 42 and the gate structure 21 is not affected by the existence of the first passivation layer 30 sandwiched there between. The first passivation layer 30 can be formed by atomic layer deposition (ALD) or in-situ metal organic chemical vapor deposition (MOCVD) through one or two depositing steps.

In this embodiment, as shown in FIG. 1A, the high electron mobility transistor 1 further includes a second passivation layer 50 deposited on top of the first passivation layer 30 in addition to the first passivation layer 30 sandwiched between the first metal electrode contact 42 and the gate structure 21. The second passivation layer 50 is a dielectric layer formed by Low Pressure Chemical Vapor Deposition (LPCVD) or Plasma-Enhanced Chemical Vapor Deposition (PECVD), which are different from the depositing method of the first passivation layer 30. Further, both the source ohmic contact opening and the drain ohmic contact opening for forming the source ohmic contact 70 and the drain ohmic contact 80 are formed after the deposition of the second passivation layer 50 is completed in this embodiment. In addition, the first metal electrode contact 42 is deposited in one deposition step in this embodiment; i.e., a metal electrode contact opening is made after the completion of the deposition of the second passivation layer 50 by etching through the second passivation layer 50.

The second embodiment of the high electron mobility transistor 1a is in shown in FIG. 1B. The second embodiment of the high electron mobility transistor 1a further includes a third passivation layer 100 deposited on top of the second passivation layer 50. The third passivation layer 100 is also a dielectric layer formed by the deposition method used to form the second passivation layer 50. Further, the dielectric materials forming the second passivation layer 50 and the third passivation layer 100 can be the same or different. The first metal electrode contact 42 is deposited in one deposition step in this embodiment; i.e., a metal electrode contact opening is formed after the deposition of the second passivation layer 50 and the third passivation layer 100 by etching through the second passivation layer 50 and the third passivation layer 100.

The third embodiment of the high electron mobility transistor 1b is shown in FIG. 1C. The third embodiment of the high electron mobility transistor 1b has a GaN epi-layer 10, a gate structure 21, a first passivation layer 30a, an additional first passivation layer 30b, a first metal electrode contact 42b, a source ohmic contact 70, a drain ohmic contact 80, and a second passivation layer 50. The first metal electrode contact 42b is formed in two separate deposition steps: In the first step of forming the first metal electrode contact 42b, the first metal electrode contact 42f is deposited on the first passivation layer 30a, and then the additional first passivation layer 30b is deposited over the first metal electrode contact 42f. The second passivation layer 50 is deposited over the additional first passivation layer 30b the additional first passivation layer deposited over the first metal electrode contact 42f. The second step of forming the first metal electrode contact 42b is performed after completion of the deposition of the second passivation layer 50 by etching through the second passivation layer 50 and the additional first passivation 30b to create a metal electrode contact opening for the deposition of the first metal electrode contact 42b.

As shown in FIG. 1C, the gate structure 21 has two sidewalls 212, 212a perpendicular or formed with certain slope to the GaN epi-layer 10 and covered by the additional first passivation 30b. In this embodiment of the present disclosure, the thickness of the first passivation layer 30a sandwiched between the first metal electrode contact 42f and the gate structure 21 can be thinner than the thickness of the additional first passivation layer 30b covering the two sidewalls 212, 212a of the gate structure 21. However, the present disclosure is not limited to this embodiment, the thickness of the first passivation layer 30a sandwiched between the first metal electrode contact 42f and the gate structure 21 can be thinner than or equal to the thickness of the additional first passivation layer 30b covering the two sidewalls 212, 212a of the gate structure 21.

Please refer to FIG. 2 to FIG. 5, which present simulated electrical behavior diagrams (Id vs. Vg) comparing a high electron mobility transistor without/with the first passivation layer sandwiched between the first metal electrode contact and the gate structure and AlN and SiN applied as the first passivation layer, and simulated gate leakage behavior diagrams (Ig vs. Vg) comparing the high electron mobility transistor without/with the first passivation layer sandwiched between the first metal electrode contact and the gate structure and with AlN and SiN applied as the first passivation layer.

Figure 2:
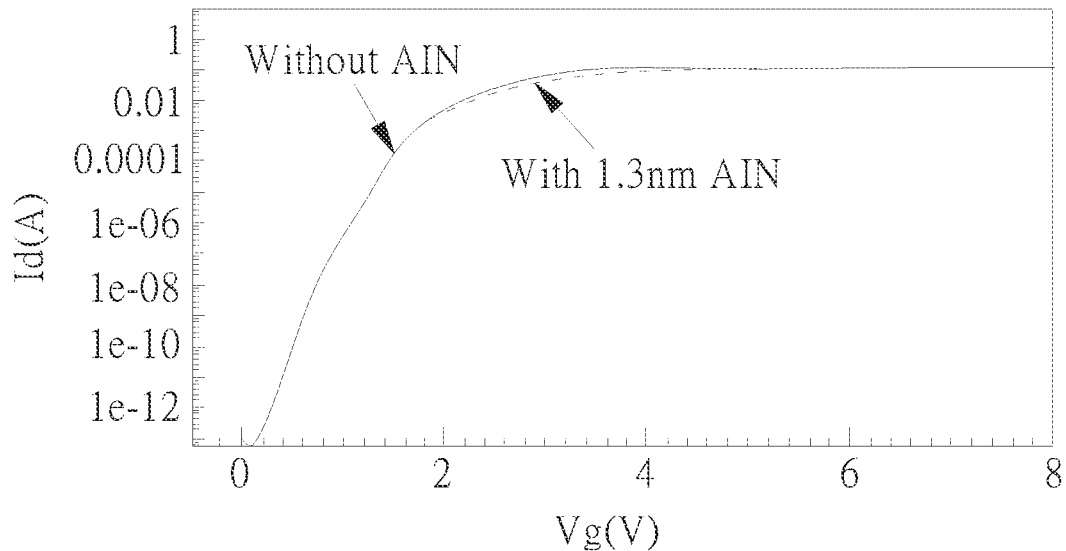
FIG. 2 illustrates a simulated electrical behavior (Id vs. Vg) comparing a high electron mobility transistor without the first passivation layer sandwiched between the first metal electrode contact and the gate structure and the high electron mobility transistor with AlN applied as the first passivation layer sandwiched between the first metal electrode contact and the gate structure.
Figure 3:
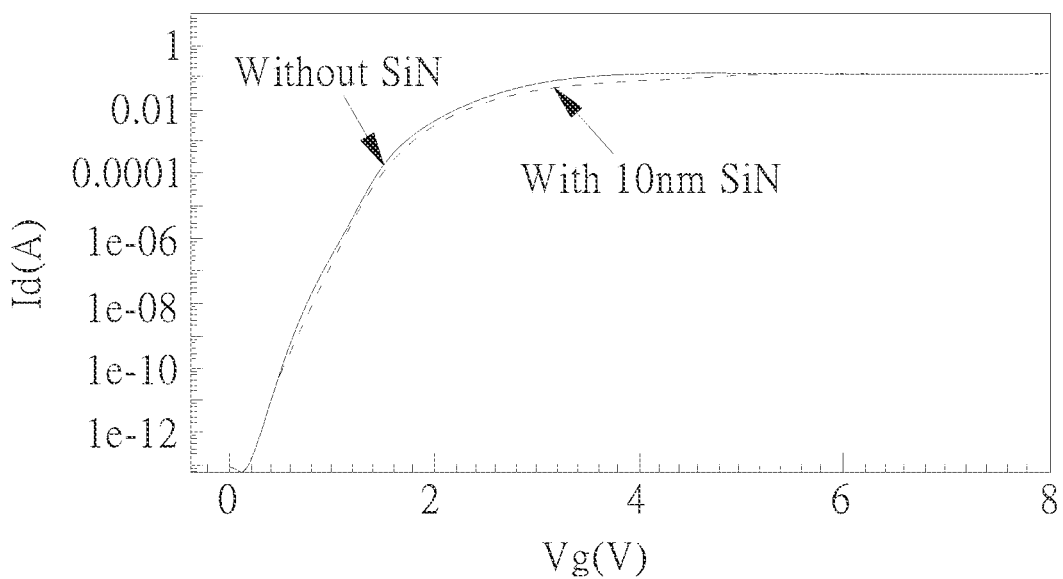
FIG. 3 illustrates a simulated electrical behavior (Id vs. Vg) comparing a high electron mobility transistor without the first passivation layer sandwiched between the first metal electrode contact and the gate structure and the high electron mobility transistor with SiN applied as the first passivation layer sandwiched between the first metal electrode contact and the gate structure.
Figure 4:
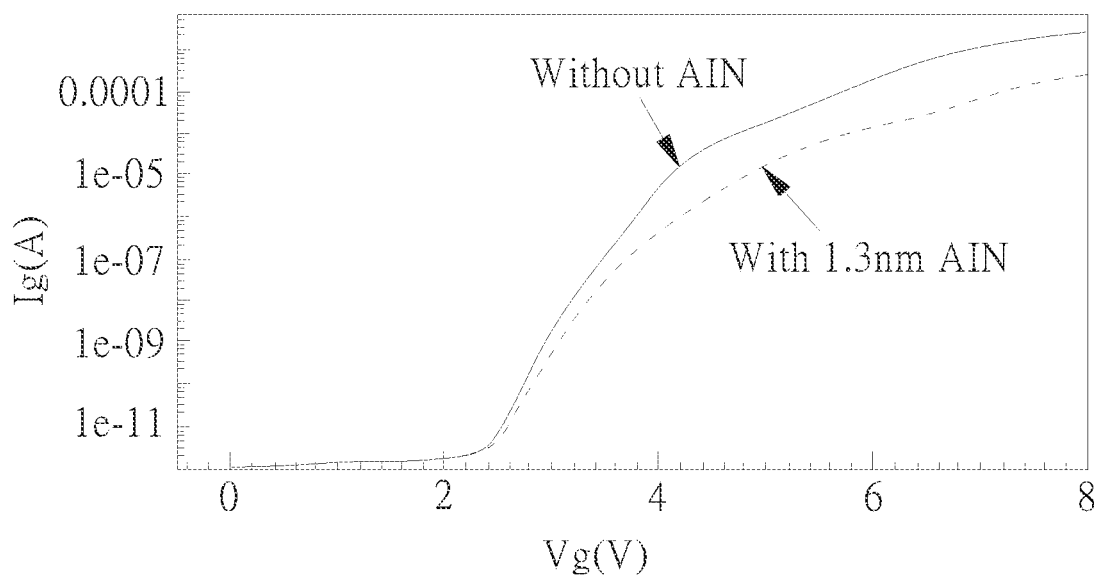
FIG. 4 illustrates a simulated gate leakage behavior (Ig vs. Vg) comparing a high electron mobility transistor without the first passivation layer sandwiched between the first metal electrode contact and the gate structure and the high electron mobility transistor with AlN applied as the first passivation layer sandwiched between the first metal electrode contact and the gate structure.
Figure 5:
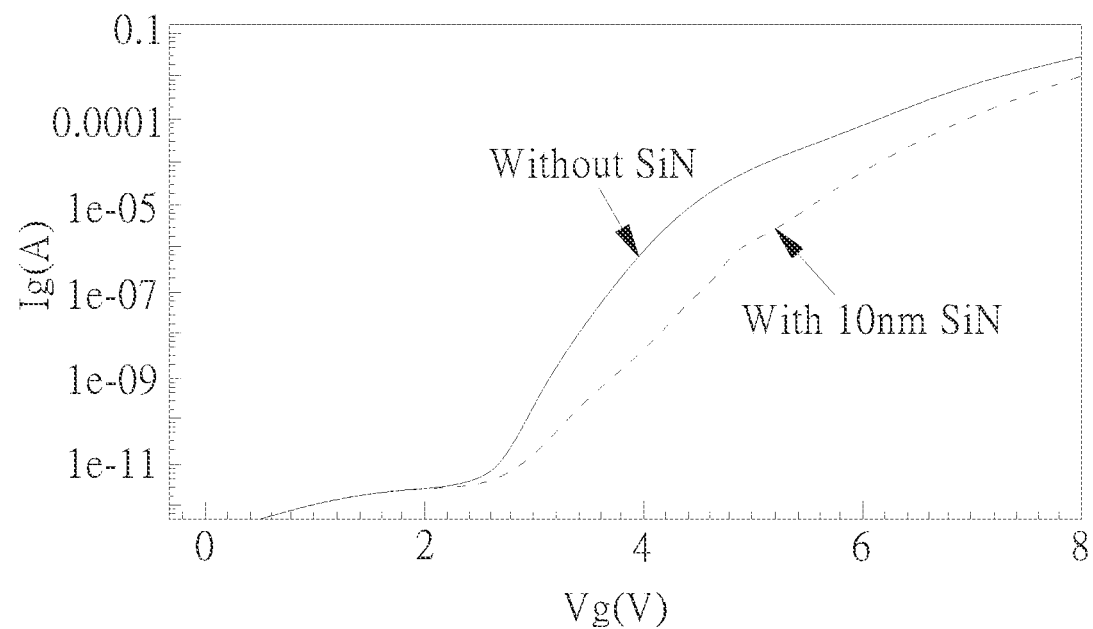
FIG. 5 illustrates a simulated gate leakage behavior (Ig vs. Vg) comparing a high electron mobility transistor without the first passivation layer sandwiched between the first metal electrode contact and the gate structure and the high electron mobility transistor with SiN applied as the first passivation layer sandwiched between the first metal electrode contact and the gate structure.

As shown in FIG. 2, there is no shift in Vth between the high electron mobility transistor 1 of the present disclosure with an AlN layer applied as the first passivation layer 30 having a thickness of 1.3 nm and a high electron mobility transistor without the AlN layer on top of the gate structure 21 (p-type GaN) of the high electron mobility transistor. As shown in FIG. 3, there is no shift in Vth between the high electron mobility transistor 1 of the present disclosure with a SiN layer applied as the first passivation layer 30 having a thickness of 10 nm and a high electron mobility transistor without a SiN layer on top of the gate structure 21 (p-type GaN) of the high electron mobility transistor. As shown in FIG. 4, the high electron mobility transistor 1 of the present disclosure with an AlN layer applied as the first passivation layer 30 having a thickness of 1.3 nm exhibits significantly lower gate leakage than that of the high electron mobility transistor without the first passivation layer 30 on top of the gate structure 21 (p-type GaN) of the high electron mobility transistor, with Ig@5V improved by 1-2 orders of magnitude. As shown in FIG. 5, the high electron mobility transistor 1 of the present disclosure with a SiN layer applied as the first passivation layer 30 having a thickness of 10 nm on top of the gate structure 21 (p-type GaN) exhibits significantly lower gate leakage than that of the high electron mobility transistor without the first passivation layer 30 on top of the gate structure 21 (p-type GaN, with Ig@5V improved by 1-2 orders of magnitude.

The simulated electrical behavior diagrams shown in FIG. 2 and FIG. 3 provide convincing evidence that an extra barrier for electron trapping and hole injection is provided between the gate metal and p-type GaN layer as long as the first passivation layer 30 is sufficiently thin to ensure that the electrical behavior of the high electron mobility transistor 1 is not affected. The first passivation layer 30 is made of materials having ultra-wide bandgap and high-k properties such as AlN, InAlN, and AlGaN, $SiO_2$, an $Al_2O_3$, a SiN, $HfO_2$, $TiO_2$, or $Ga_2O_3$, or a combination of the two of the above-mentioned materials with one material deposited on top of the other one, such as the first passivation layer 30 can be a two-layer combination made of a AlN layer situated on a SiN layer.

Figure 6:
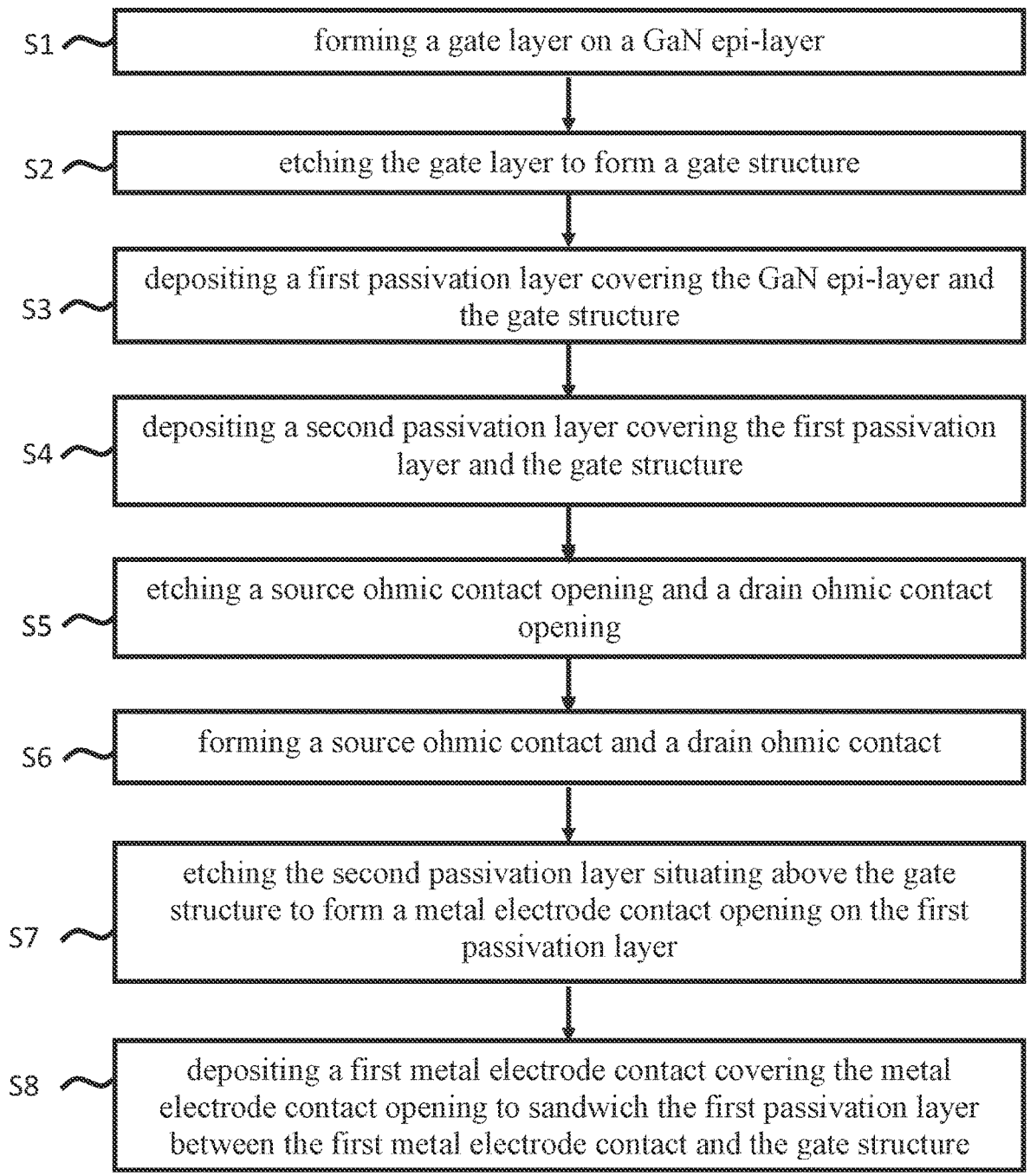
FIG. 6 is a flow chart showing a first embodiment of a high electron mobility transistor forming method.

Please refer to FIG. 6 and FIG. 7A to FIG. 7H. FIG. 6 is a flow chart showing a first embodiment of a high electron mobility transistor forming method and FIG. 7A to FIG. 7H illustrate the first embodiment of a high electron mobility transistor forming method.

As shown in FIG. 6 and FIG. 7A to FIG. 7H, the high electron mobility transistor 1 has a GaN epi-layer 10 including a substrate 11, a GaN buffer layer 12, and a barrier layer 13. The GaN buffer layer 12 is disposed between the substrate 11 and the barrier layer 13. According to one embodiment of the present disclosure, the substrate 11 can be made of silicon, sapphire, SiC or other more complex materials such as SOI (Silicon On Insulator) or QST substrate; the GaN buffer 12 can be made of a GaN layer on top of a graded $Al_xGa_{1-x}N$ or AlN/GaN supper lattice; and the barrier layer 13 is made of $Al_yGa_{1-y}N$. The first embodiment of the high electron mobility transistor forming method includes the following steps:

S1: Forming a gate layer on a GaN epi-layer.

Figure 7A:
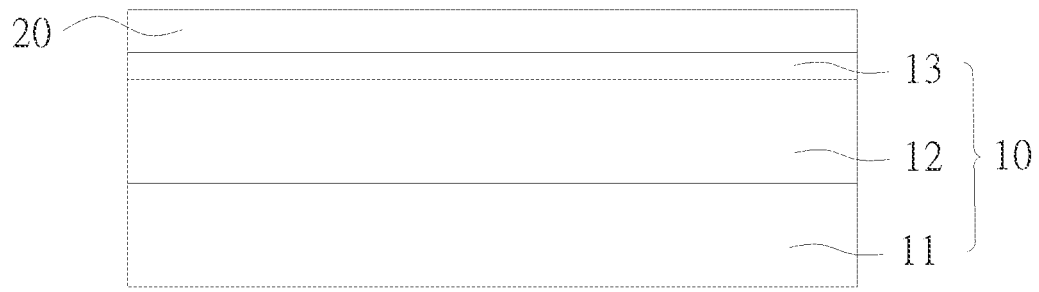
FIG. 7A to FIG. 7H illustrate the first embodiment of a high electron mobility transistor forming method.

As shown in FIG. 7A, the gate layer 20 on a GaN epi-layer 10 is a p-type GaN layer. However, the present application is not limited to this embodiment, for the gate layer 20 can also be an n-type GaN layer, an InGaN layer, or an AlGaN layer.

S2: Etching the gate layer to form a gate structure.

Figure 7B:
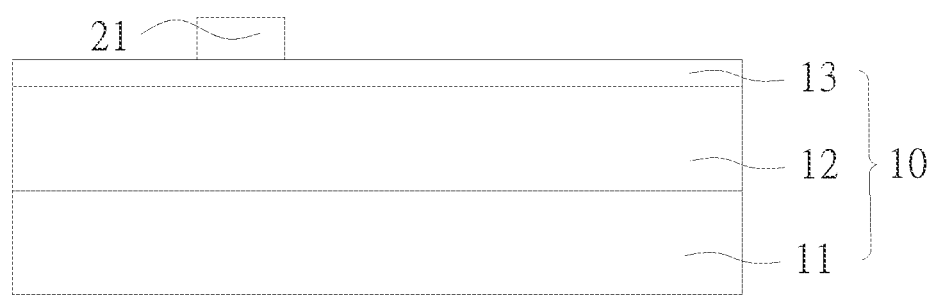

As shown in FIG. 7B, the gate structure 21 is formed on the barrier layer 11 by etching the gate layer 20. Because the gate layer 20 is a p-type GaN layer, the gate structure 21 is a p-type GaN structure in this embodiment accordingly. However, because the gate layer 20 can also be an n-type GaN layer, an InGaN layer, or an AlGaN layer, the gate structure 21 can also be an n-type GaN, an InGaN, or an AlGaN accordingly.

S3: Depositing a first passivation layer covering the GaN epi-layer and the gate structure.

Figure 7C:
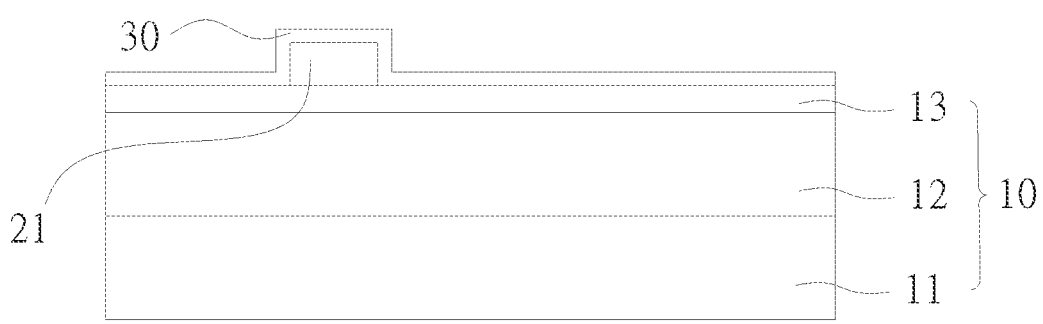

As shown in FIG. 7C, in this embodiment, the first passivation layer 30 is an AlN layer and can be formed by atomic layer deposition (ALD) or in-situ metal organic chemical vapor deposition (MOCVD) to cover the GaN epi-layer 10 and the gate structure 21. However, the present application is not limited to this embodiment, for a high K dielectric material such as an InAlN layer, an AlGaN layer, a $SiO_2$ layer, an $Al_2O_3$ layer, a SiN layer, a $HfO_2$ layer, a $TiO_2$ layer, or a $Ga_2O_3$ layer can be applied to the first passivation layer 30 as well.

S4: Depositing a second passivation layer covering the first passivation layer and the gate structure.

Figure 7D:
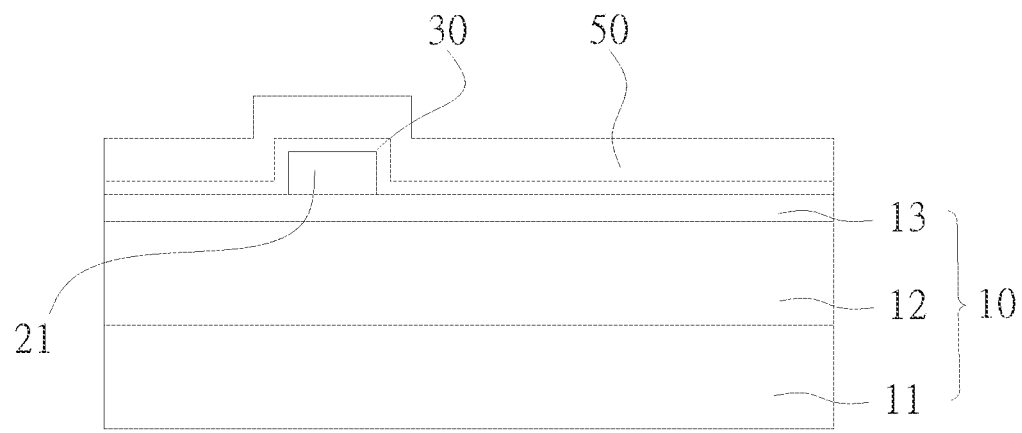

As shown in FIG. 7D, the second passivation layer 50 is a dielectric layer deposited on top of the first passivation layer 30 and the gate structure 21 by Low Pressure Chemical Vapor Deposition (LPCVD) or Plasma-Enhanced Chemical Vapor Deposition (PECVD), which are different from the depositing method of the first passivation layer 30.

S5: Etching a source ohmic contact opening and a drain ohmic contact opening.

Figure 7E:
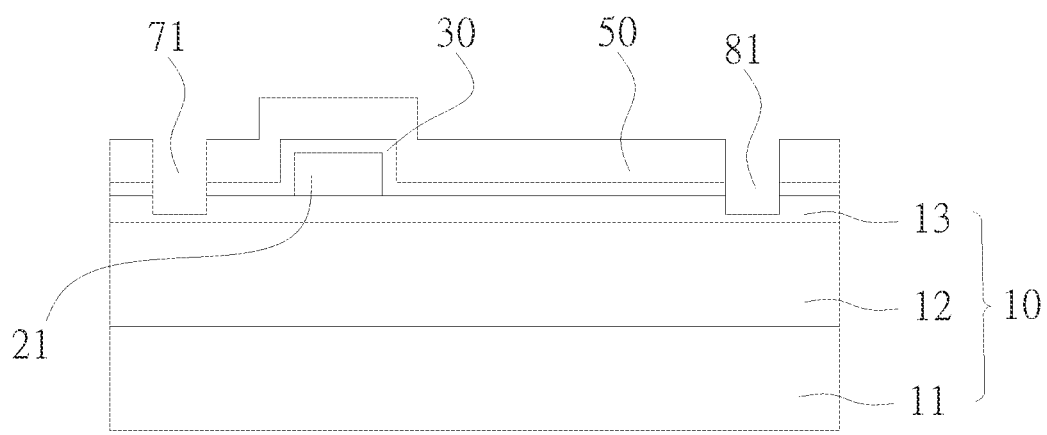

As shown in FIG. 7E, in this embodiment, the second passivation layer 50, the first passivation layer 30 and the barrier layer 13 are etched to form a source ohmic contact opening 71 and a drain ohmic contact opening 81 on the barrier layer 13. It is noted that, according to another embodiment of the present disclosure, the etching stops when the barrier layer 13 is reached; i.e. only the second passivation layer 50 and the first passivation layer 30 are etched to form the source ohmic contact opening 71 and the drain ohmic contact opening 81.

S6: Forming a source ohmic contact and a drain ohmic contact.

Figure 7F:
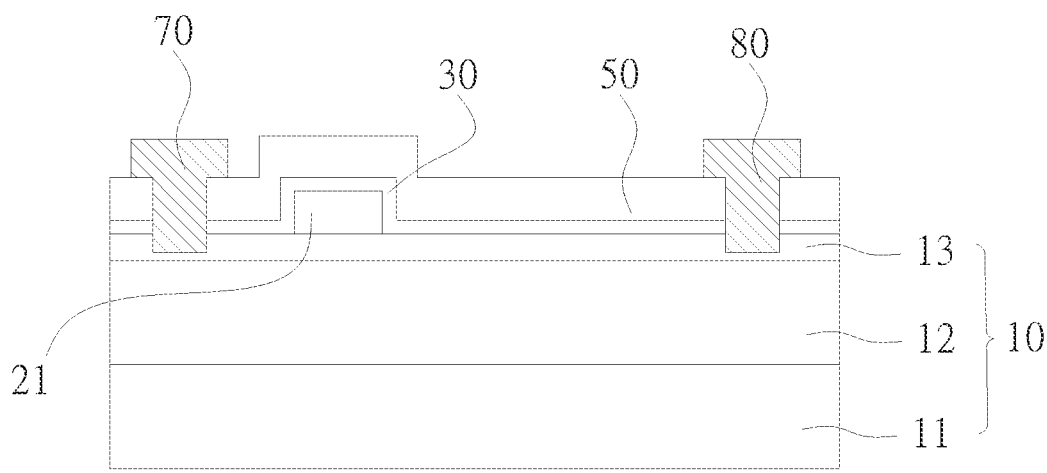

As shown in FIG. 7F, in this embodiment, the source ohmic contact 70 and the drain ohmic contact 80 are deposited through the source ohmic contact opening 71 and the drain ohmic contact opening 81 and are formed into the barrier layer 13. It is noted that, according to another embodiment of the present disclosure, the source ohmic contact opening 71 and the drain ohmic contact opening 81 are formed on the surface of the barrier layer 13.

S7: Etching the second passivation layer situated above the gate structure to form a metal electrode contact opening on the first passivation layer.

Figure 7G:
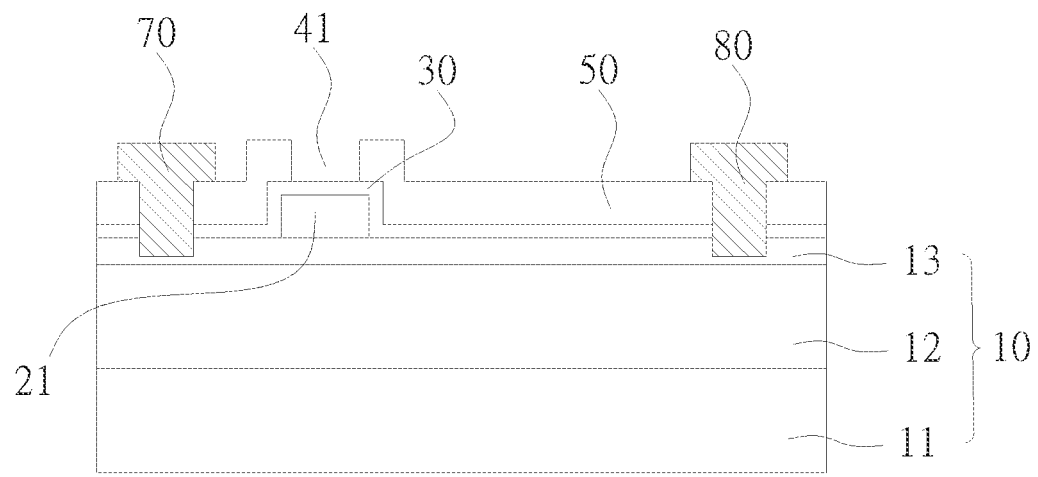

As shown in FIG. 7G, the second passivation layer 50 is etched and the etching stops upon reaching the first passivation layer 30 such that a metal electrode contact opening 41 is formed on the first passivation layer 30.

S8: Depositing a first metal electrode contact covering the metal electrode contact opening to sandwich the first passivation layer between the first metal electrode contact and the gate structure.

Figure 7H:
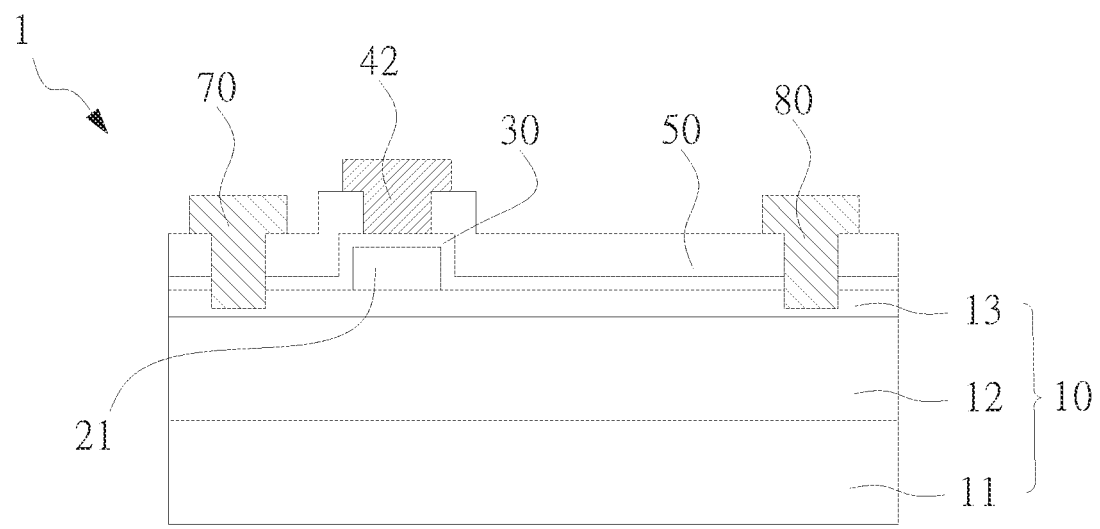

As shown in FIG. 7H, the first metal electrode contact 42 is deposited on the first passivation layer 30 on the gate structure 21 through the metal electrode contact opening 41 such that the high electron mobility transistor 1 is formed with the first passivation layer 30 sandwiched between the first metal electrode contact 42 and the gate structure 21. It is noted that the thickness of the first passivation layer 30 sandwiched between the first metal electrode contact 42 and the gate structure 21 is less than 10 nm to ensure that the electrical behavior between the first metal electrode contact 42 and the gate structure 21 is not affected by the existence of the first passivation layer 30 sandwiched there between.

Figure 8A:
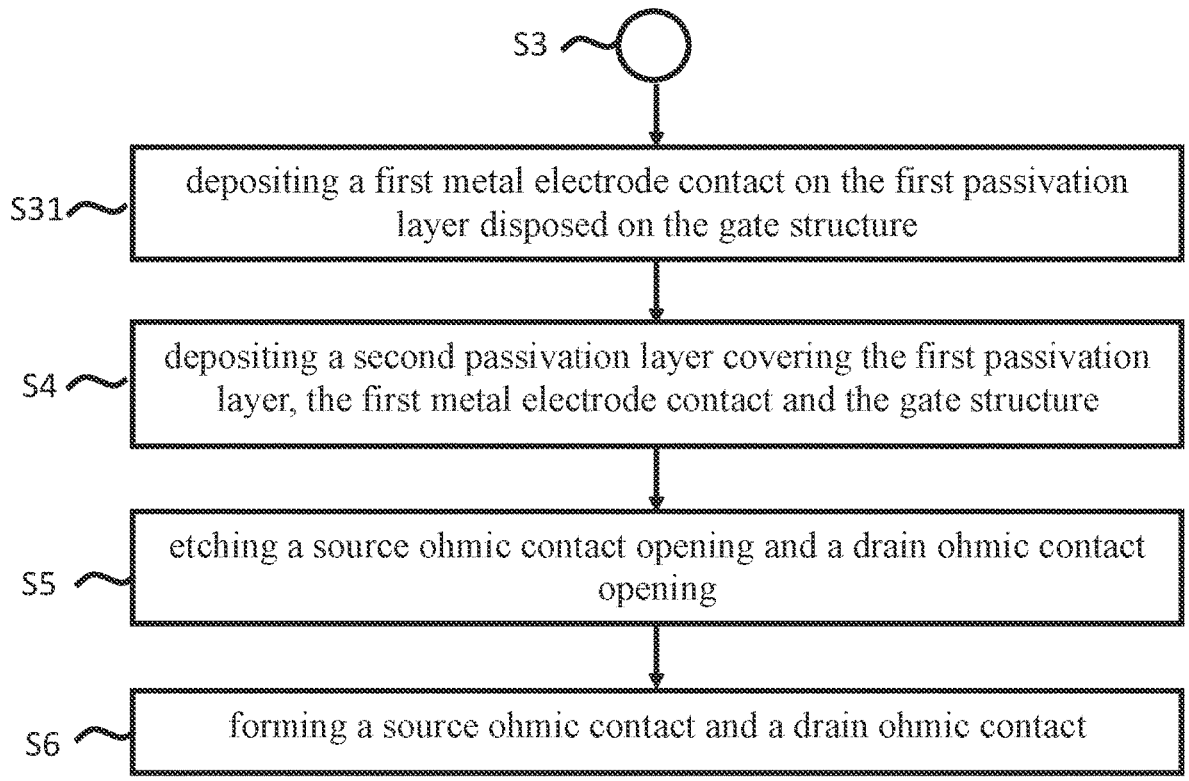
FIG. 8A is a flow chart showing a second embodiment of a high electron mobility transistor forming method.

Please refer to FIG. 8A and FIG. 9A to FIG. 9D. FIG. 8A is a flow chart showing a second embodiment of a high electron mobility transistor forming method and FIG. 9A to FIG. 9D illustrate the second embodiment of a high electron mobility transistor forming method. It is noted that, as shown in FIG. 8A, steps S1, S2, and S3 in the second embodiment are the same as steps S1, S2, and S3 in the first embodiment; therefore, detailed descriptions of steps S1, S2, and S3 are omitted from the description of the second embodiment.

S31: Depositing a first metal electrode contact on the first passivation layer disposed on the gate structure.

Figure 9A:
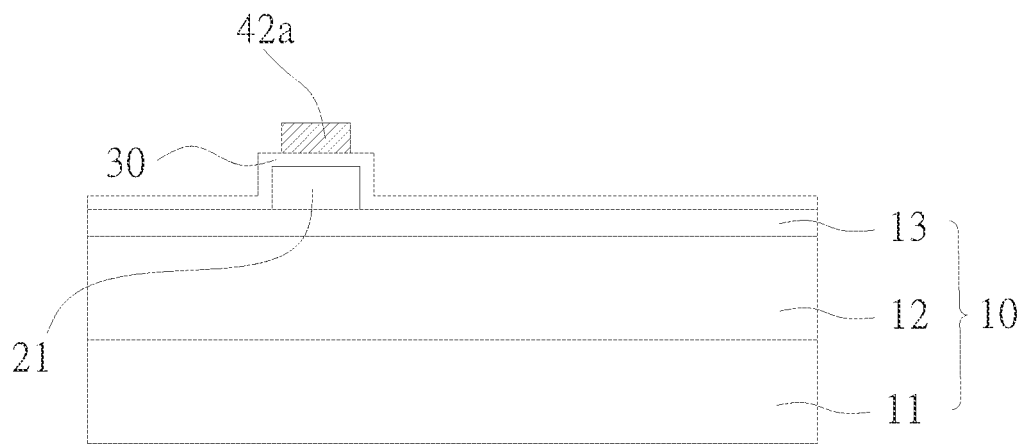
FIG. 9A to FIG. 9D illustrate the second embodiment of a high electron mobility transistor forming method.

As shown in FIG. 9A, the first metal electrode contact 42a is deposited on the first passivation layer 30, which is disposed on the gate structure 21; i.e., the first passivation layer 30 disposed on the gate structure 21 is sandwiched between the first metal electrode contact 42a and the gate structure 21.

S4: Depositing a second passivation layer covering the first passivation layer, the first metal electrode contact and the gate structure.

Figure 9B:
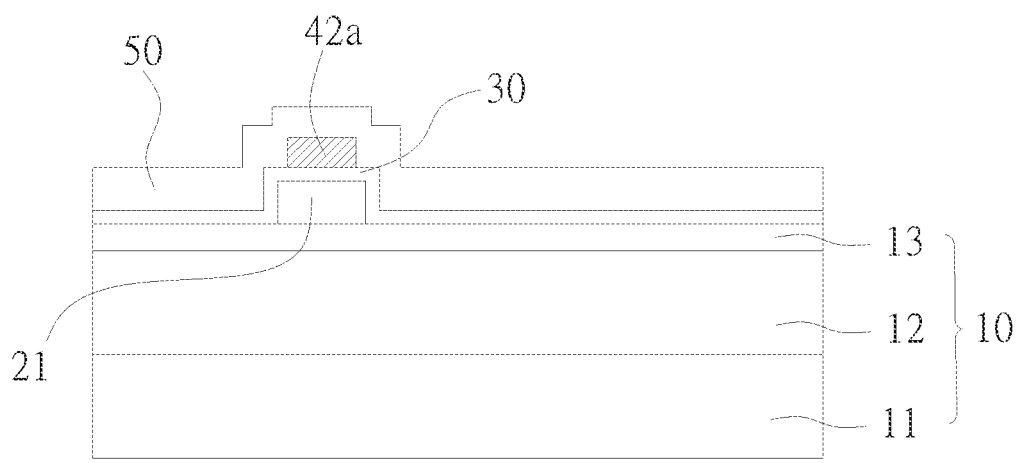

As shown in FIG. 9B, the second passivation layer 50 is a dielectric layer deposited on top of the first passivation layer 30, the first metal electrode contact 42a and the gate structure 21 by LPCVD or PECVD, which are different from the depositing method of the first passivation layer 30.

S5: Etching a source ohmic contact opening and a drain ohmic contact opening.

Figure 9C:
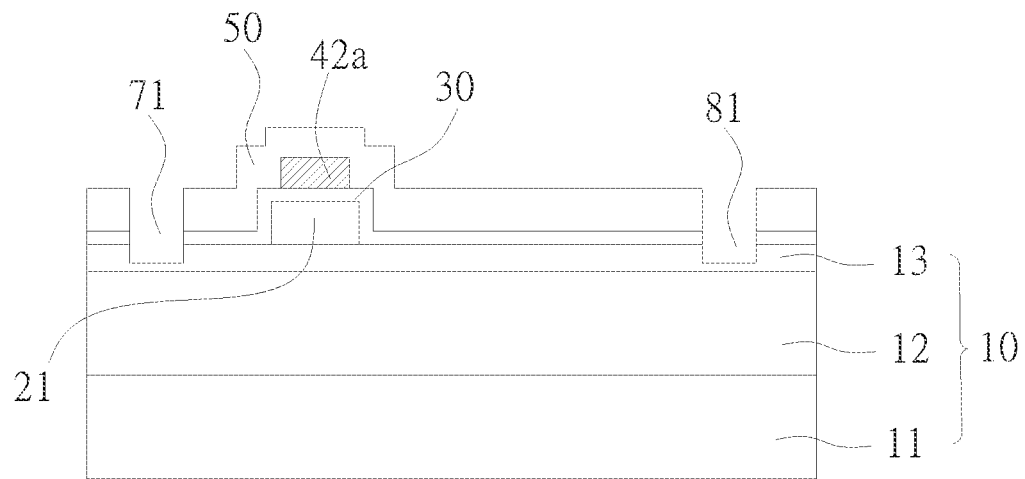

As shown in FIG. 9C, the second passivation layer 50, the first passivation layer 30 and the barrier layer 13 are etched to form a source ohmic contact opening 71 and a drain ohmic contact opening 81 on the barrier layer 13.

S6: Forming a source ohmic contact and a drain ohmic contact.

Figure 9D:
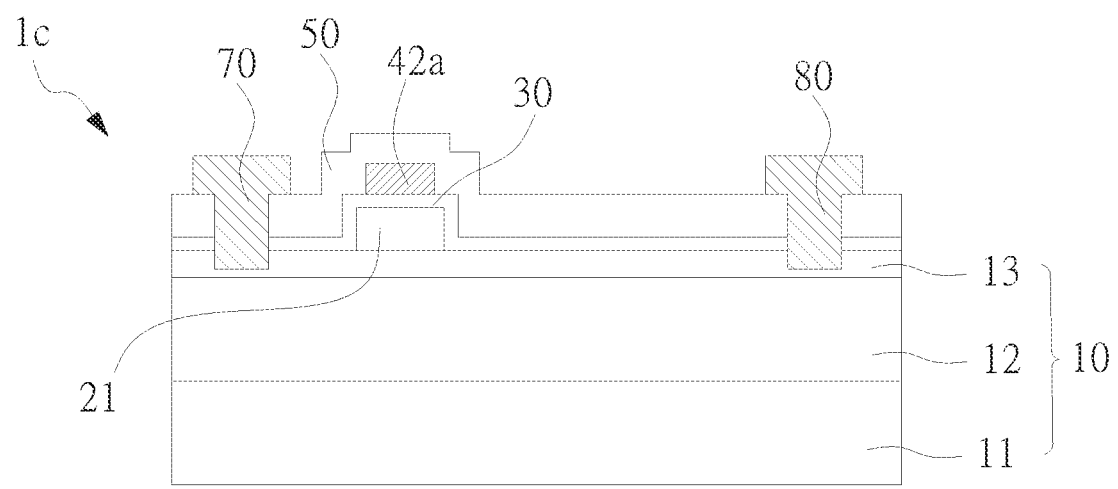

As shown in FIG. 9D, the source ohmic contact 70 and the drain ohmic contact 80 are deposited through the source ohmic contact opening 71 and the drain ohmic contact opening 81 and are formed on the barrier layer 13, and the high electron mobility transistor 1c is formed with the first passivation layer 30 sandwiched between the first metal electrode contact 42a and the gate structure 21. It is noted that the thickness of the first passivation layer 30 sandwiched between the first metal electrode contact 42a and the gate structure 21 is less than 10 nm to ensure that the electrical behavior between the first metal electrode contact 42a and the gate structure 21 is not affected by the existence of the first passivation layer 30 sandwiched there between.

Figure 8B:
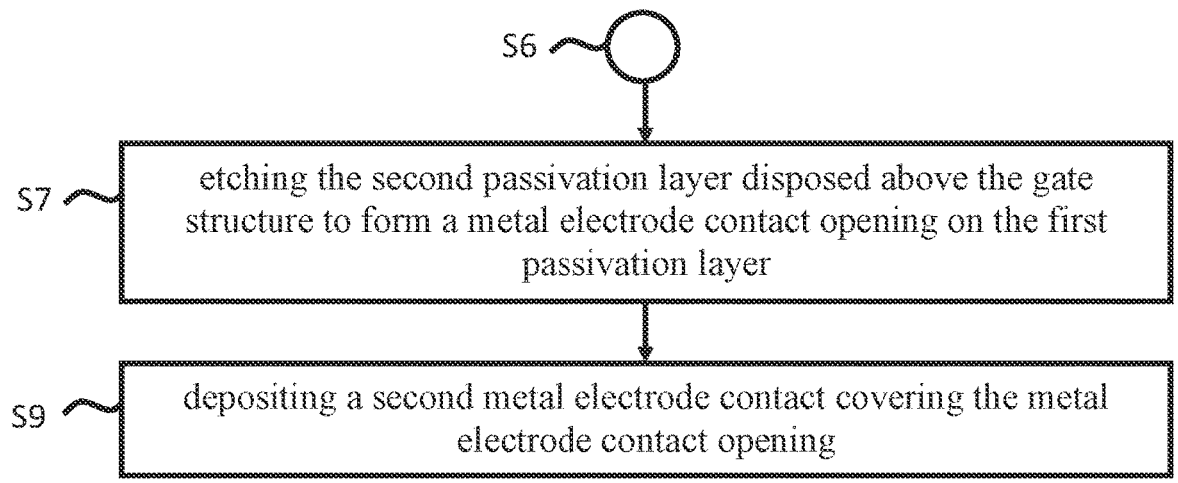
FIG. 8B is a flow chart showing a third embodiment of a high electron mobility transistor forming method.
Figure 9E:
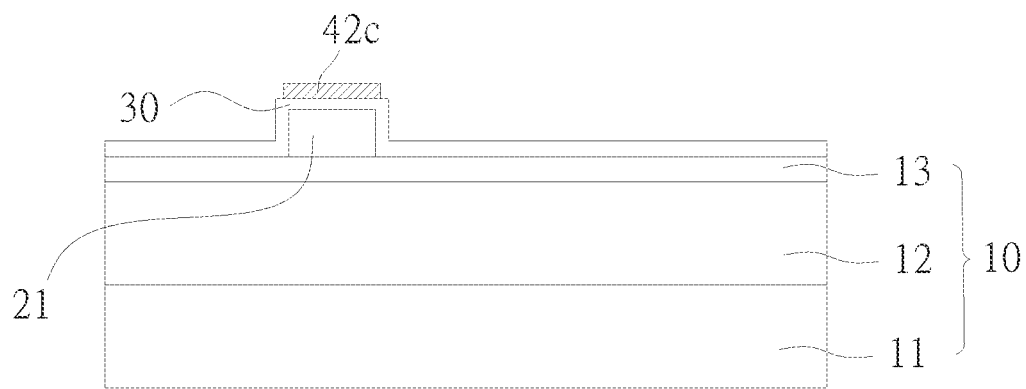
FIG. 9E to FIG. 9J illustrate the third embodiment of a high electron mobility transistor forming method.
Figure 9F:
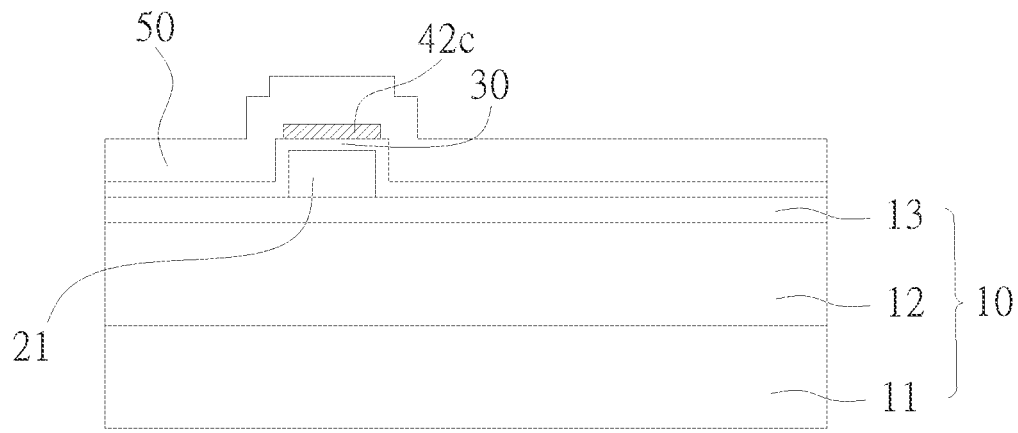
Figure 9G:
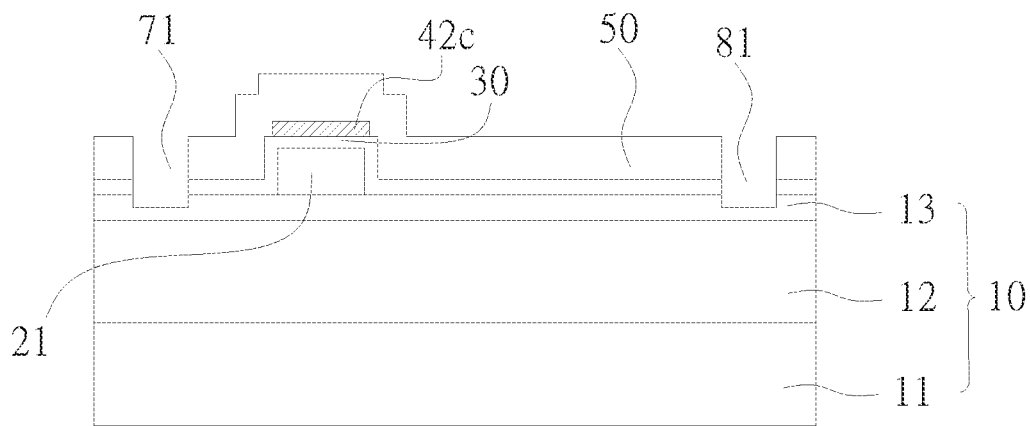
Figure 9H:
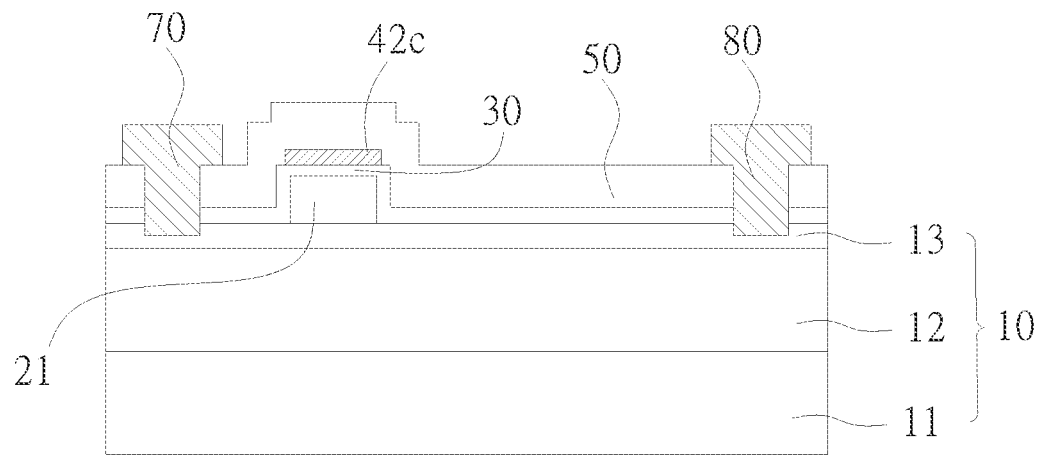
Figure 9I:
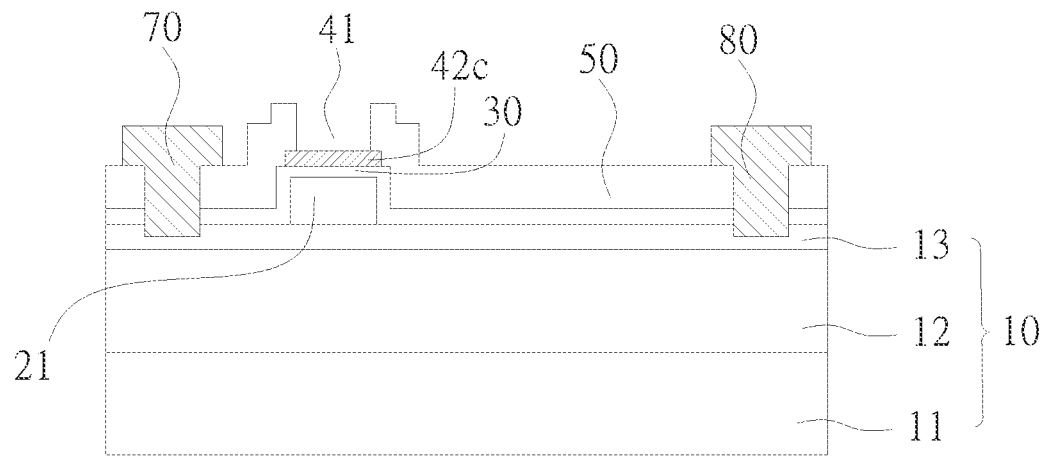
Figure 9J:
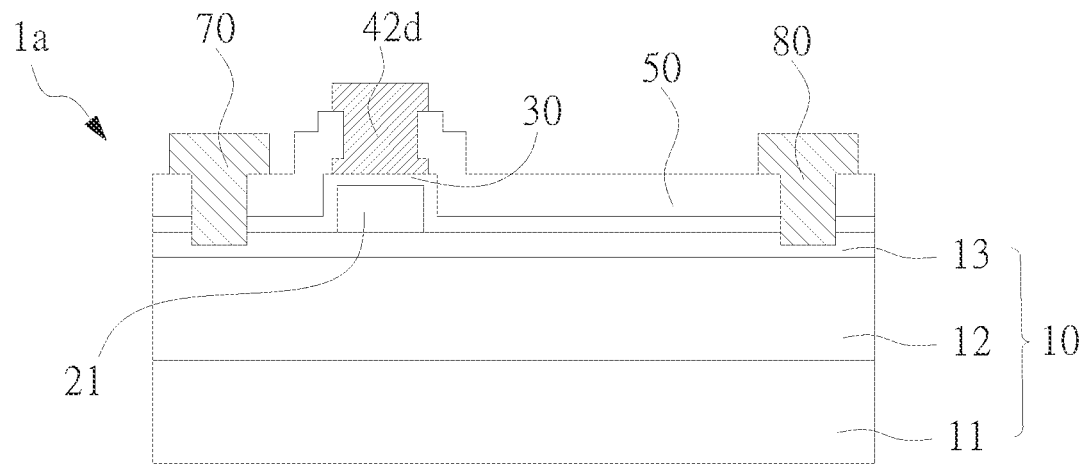

Please refer to FIG. 8B, FIG. 9E and FIG. 9J. FIG. 8B is a flow chart showing a third embodiment of a high electron mobility transistor forming method. FIG. 9E to FIG. 9J illustrate the third embodiment of a high electron mobility transistor forming method.

It is noted that, as shown in FIG. 8B, the third embodiment of a high electron mobility transistor forming method differs from the second embodiment in two aspects: 1. The third embodiment further includes step S7 and S9 after step S6; detailed descriptions of steps before S6, such as step S1 to S3 in the first embodiment and steps S31 and S4 to S6 in the second embodiment are omitted. 2. The thickness of the first metal electrode contact 42c in the third embodiment is smaller than that in the second embodiment, and steps S31 and S4 to S6 in the third embodiment are presented in FIG. 9E to FIG. 9H.

S7: Etching the second passivation layer disposed above the gate structure to form a metal electrode contact opening on the first passivation layer.

As shown in FIG. 9I, a metal electrode contact opening 41 is etched through the second passivation layer 50, and the etching is stopped when the first metal electrode contact 42c is reached.

S9: Depositing a second metal electrode contact covering the metal electrode contact opening.

As shown in FIG. 9I and FIG. 9J, a second metal electrode contact 42d is deposited on the first metal electrode contact 42c on the gate structure 21 through the metal electrode contact opening 41 such that the high electron mobility transistor 1a is formed with the first passivation layer 30 sandwiched between the first metal electrode contact 42c and the gate structure 21.

Please refer to FIG. 10A and FIG. 11A to FIG. 11G. FIG. 10 is a flow chart showing a fourth embodiment of a high electron mobility transistor forming method. FIG. 11A to FIG. 11G illustrate the fourth embodiment of a high electron mobility transistor forming method. As shown in FIG. 10A and FIG. 11A to FIG. 11G, the fourth embodiment of the high electron mobility transistor (HEMT) forming method includes the following steps:

S1: Forming a gate layer on a GaN epi-layer.

Figure 11A:
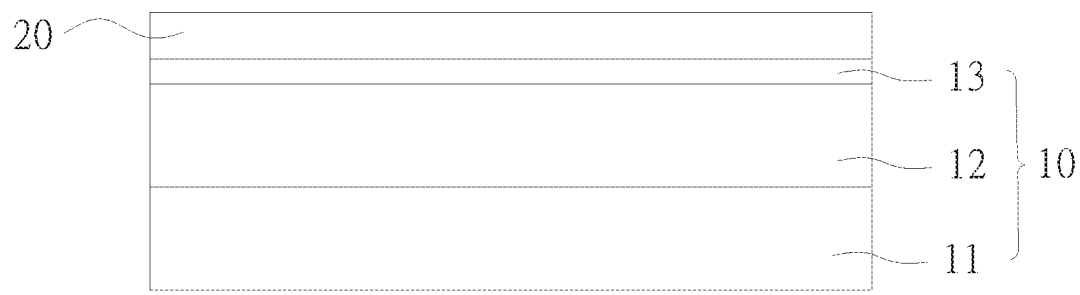
FIG. 11A to FIG. 11G illustrate the fourth embodiment of a high electron mobility transistor forming method.

As shown in FIG. 11A, a gate layer 20 on a GaN epi-layer 10 is a p-type GaN layer. However, the present application is not limited to this embodiment, for the gate layer 20 can also be an n-type GaN layer, an InGaN layer, or an AlGaN layer.

S2a: Depositing a first passivation layer on the gate layer.

Figure 11B:
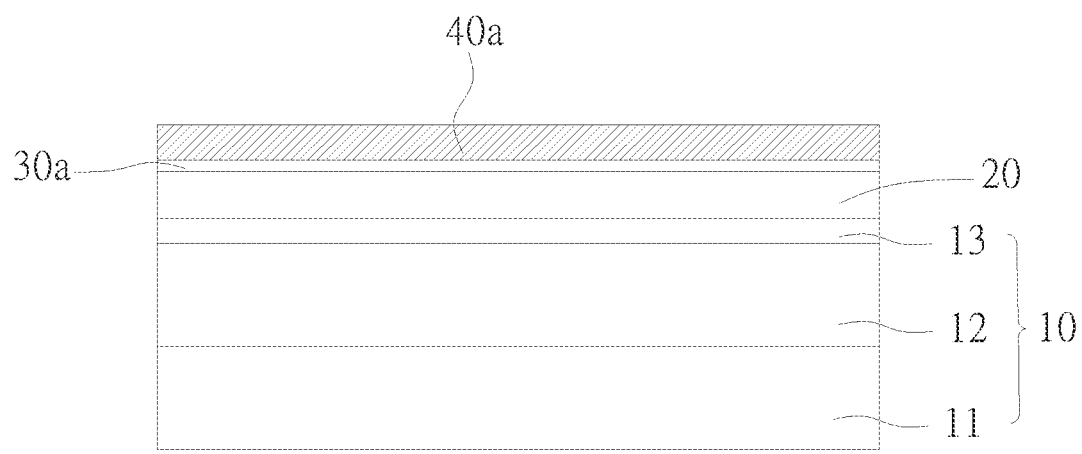

As shown in FIG. 11B, a first passivation layer 30a is deposited on the gate layer 20 by either in-situ metal organic chemical vapor deposition (MOCVD) or ex-situ atomic layer deposition (ALD). In this embodiment, the first passivation layer 30a is an AlN layer. It is noted that the present application is not limited to this embodiment, for a high K dielectric material such as an InAlN layer, an AlGaN layer, a $SiO_2$ layer, an $Al_2O_3$ layer, a SiN layer, a $HfO_2$ layer, a $TiO_2$ layer, or a $Ga_2O_3$ layer or a combination of the two of the above-mentioned materials with one material deposited on top of the other one, such as the first passivation layer 30 can be a two-layer combination made of a AlN layer situated on a SiN layer, can be applied as the first passivation layer 30a as well.

S3a: Depositing a first metal electrode contact layer on the first passivation layer.

As shown in FIG. 11B, a first metal electrode contact layer 40a is deposited on the passivation layer 30a. The first metal electrode contact layer 40a is a thin layer for protecting the first passivation layer 30a, and the first metal electrode contact layer 40a is a TiN layer in this embodiment.

S4a: Etching the first metal electrode contact layer, the first passivation layer and the gate layer to define a gate structure and a first metal electrode contact, wherein the passivation layer sandwiched between the first metal electrode contact and the gate structure remains intact.

Figure 11C:
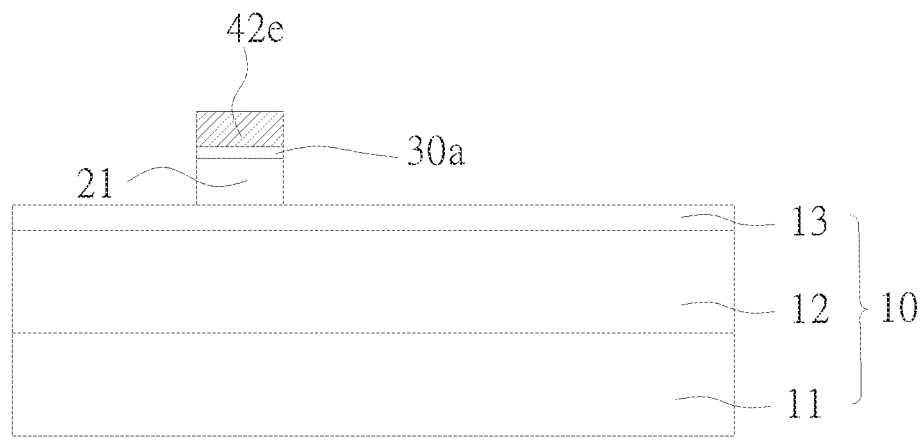

As shown in FIG. 11C, the first metal electrode contact layer 40a, the first passivation layer 30a and the gate layer 20 are etched to define a gate structure 21 and a first metal electrode contact 42e. It is noted that the first-passivation layer 30a sandwiched between the first metal electrode contact 42e and the gate structure 21 remains intact. The thickness of the first passivation layer 30a sandwiched between the first metal electrode contact 42e and the gate structure 21 is less than 10 nm to ensure that the electrical behavior between the first metal electrode contact 42 and the gate structure 21 is not affected by the existence of the first passivation layer 30a sandwiched there between.

S5a: Depositing an additional first passivation layer covering the GaN epi-layer, the first metal electrode contact and the gate structure.

Figure 11D:
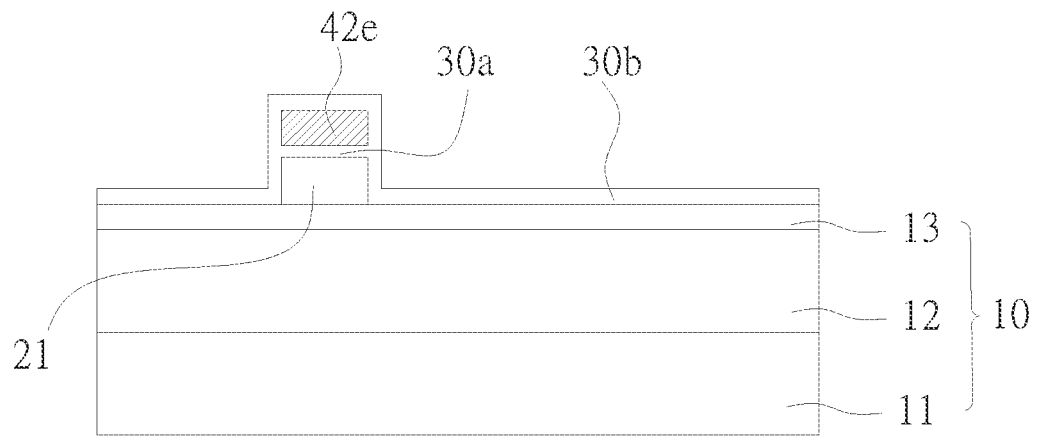

As shown in FIG. 11D, an additional first passivation layer 30b is deposited such that it covers the GaN epi-layer 10, the first metal electrode contact 42e and the gate structure 21. It is noted that the additional first passivation layer 30b in S5a is an additional AlN layer formed by atomic layer deposition (ALD) or MOCVD. The additional first passivation layer 30b in S5a can be a high K dielectric material such as an InAlN layer, an AlGaN layer, a $SiO_2$ layer, an $Al_2O_3$ layer, a SiN layer, a $HfO_2$ layer, a $TiO_2$ layer, or a $Ga_2O_3$ layer or a combination of the two of the above-mentioned materials with one material deposited on top of the other one, such as the additional first passivation layer 30b can be a two-layer combination made of a AlN layer situated on a SiN layer.

S6a: Depositing a second passivation layer covering the first passivation layer.

Figure 11E:
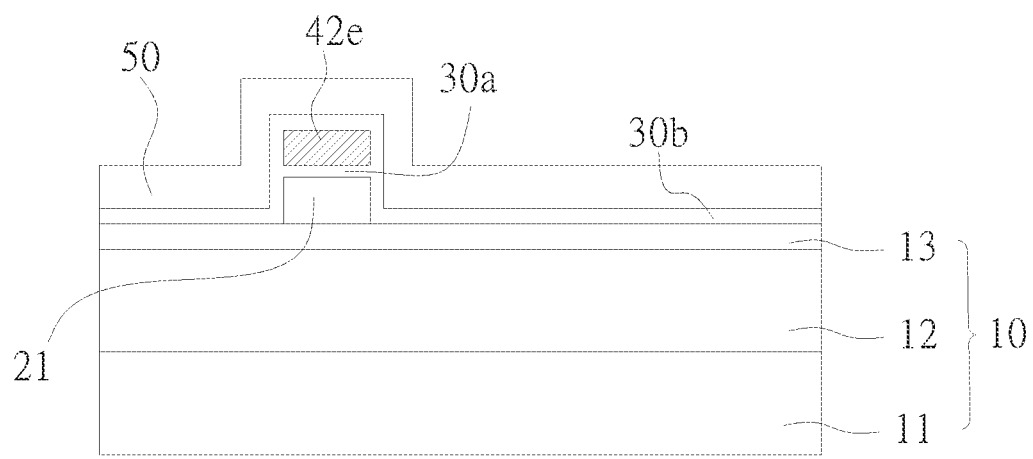

As shown in FIG. 11E, the second passivation layer 50 is a dielectric layer deposited on top of the additional first passivation layer 30b by LPCVD or PECVD, which are different from the depositing method of the first passivation layer 30a or the additional first passivation layer 30b.

S7a: Etching a source ohmic contact opening and a drain ohmic contact opening.

Figure 11F:
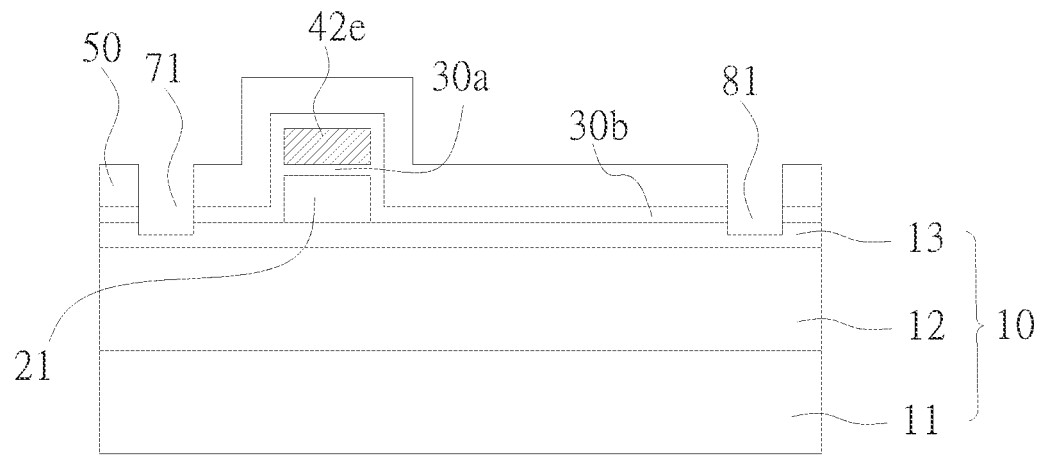

As shown in FIG. 11F, the second passivation layer 50, the additional first passivation layer 30b and the barrier layer 13 are etched to form a source ohmic contact opening 71 and a drain ohmic contact opening 81 on the barrier layer 13.

S8a: Forming a source ohmic contact and a drain ohmic contact.

Figure 11G:
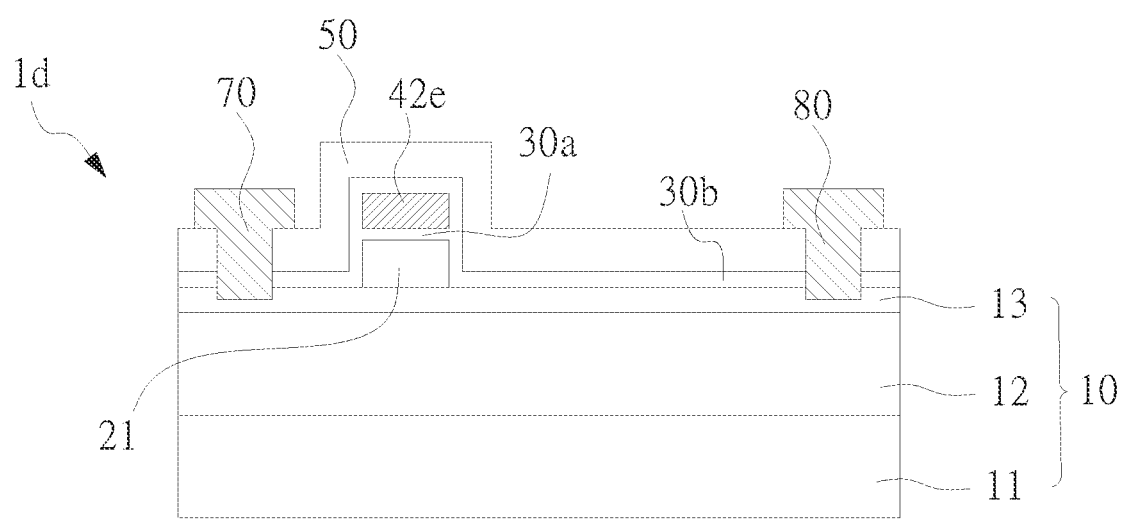

As shown in FIG. 11G, the source ohmic contact 70 and the drain ohmic contact 80 are deposited through the source ohmic contact opening 71 and the drain ohmic contact opening 81 and are formed on the barrier layer 13. The high electron mobility transistor 1d is formed with the first passivation layer 30a sandwiched between the first metal electrode contact 42e and the gate structure 21. It is noted that the thickness of the first passivation layer 30a sandwiched between the first metal electrode contact 42e and the gate structure 21 is less than 10 nm. According to one embodiment of the present disclosure, in the high electron mobility transistor 1d formed by the fourth embodiment of the forming method, the additional first passivation layer 30b on the sidewall of gate structure 21 can be thicker than the first passivation layer 30a between the gate structure 21 and first metal electrode contact 42e.

Figure 10:
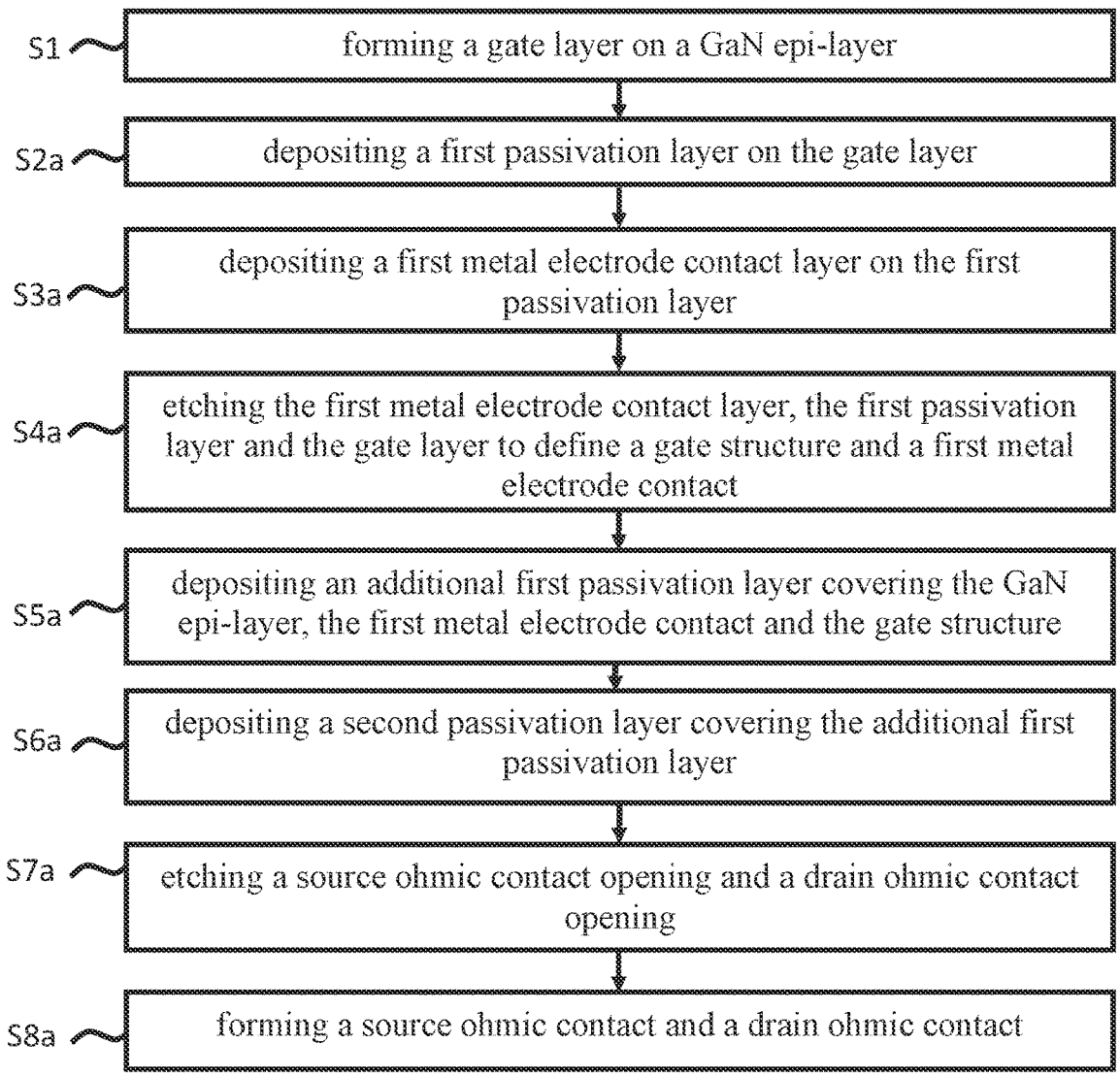
FIG. 10A is a flow chart showing a fourth embodiment of a high electron mobility transistor forming method.
FIG. 10B is a flow chart showing a fifth embodiment of a high electron mobility transistor forming method.
Figure 10B:
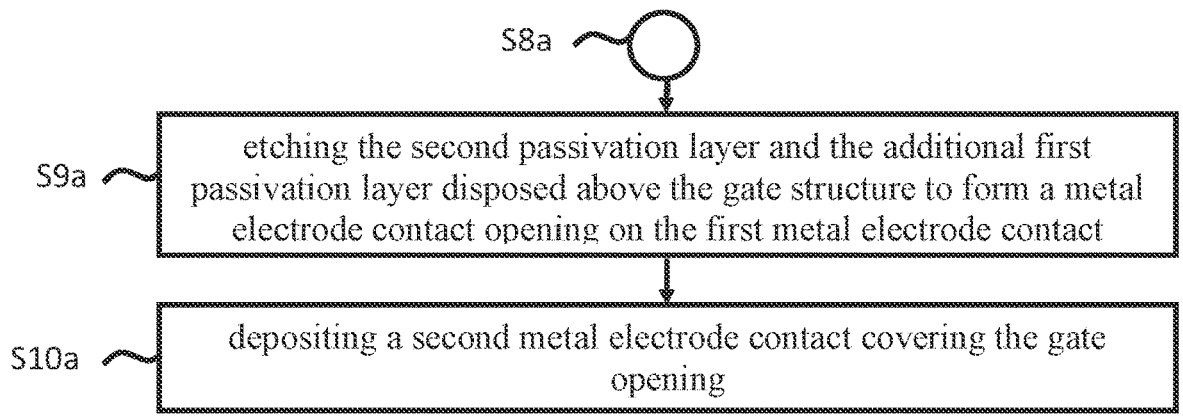

Please refer to FIG. 10B and FIG. 12A to FIG. 12J. FIG. 10B is a flow chart showing a fifth embodiment of a high electron mobility transistor forming method. FIG. 12A to FIG. 12J illustrate the fifth embodiment of a high electron mobility transistor forming method.

Figure 12A:
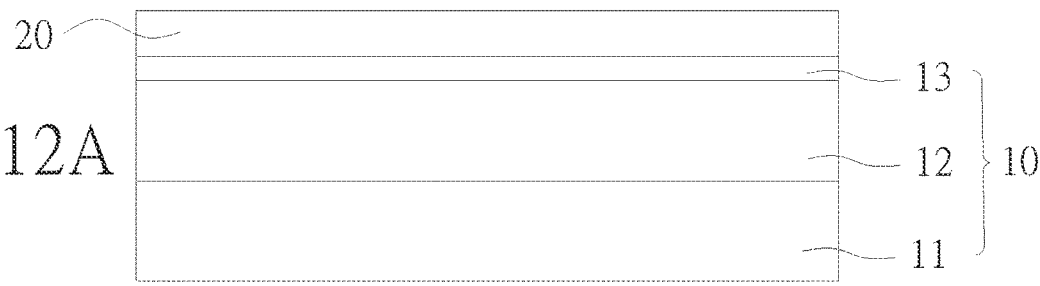
FIG. 12A to FIG. 12J illustrate the fifth embodiment of a high electron mobility transistor forming method.
Figure 12B:
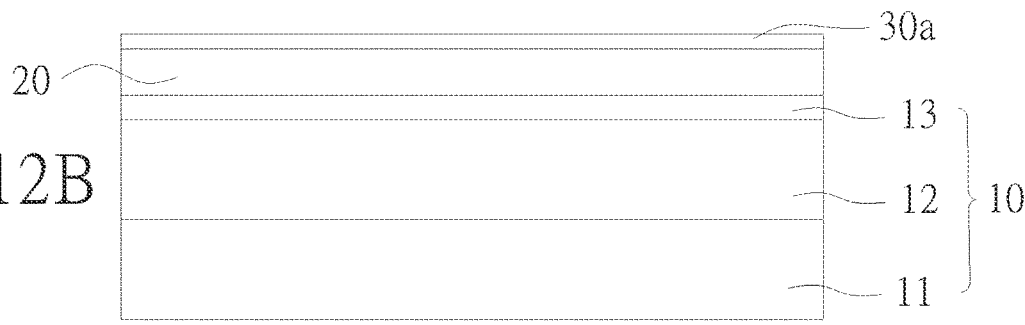

In the fifth embodiment of a high electron mobility transistor forming method, as shown in FIG. 12A, a gate layer 20 on a GaN epi-layer 10 is a p-type GaN layer. However, the present application is not limited to this embodiment, for the gate layer 20 can also be an n-type GaN layer, an InGaN layer, or an AlGaN layer. As shown in FIG. 12B, a first passivation layer 30a is deposited on the gate layer 20 by MOCVD. In this embodiment, the first passivation layer 30a is an AlN layer. It is noted that the present application is not limited to this embodiment, for a high K dielectric material such as an InAlN layer, an AlGaN layer, a $SiO_2$ layer, an $Al_2O_3$ layer, a SiN layer, a $HfO_2$ layer, a $TiO_2$ layer, or a $Ga_2O_3$ layer, or a combination of the two of the above-mentioned materials with one material deposited on top of the other one, such as the first passivation layer 30a can be a two-layer combination made of a AlN layer situated on a SiN layer, can be applied as the first passivation layer 30a as well.

Figure 12C:
Figure 12D:
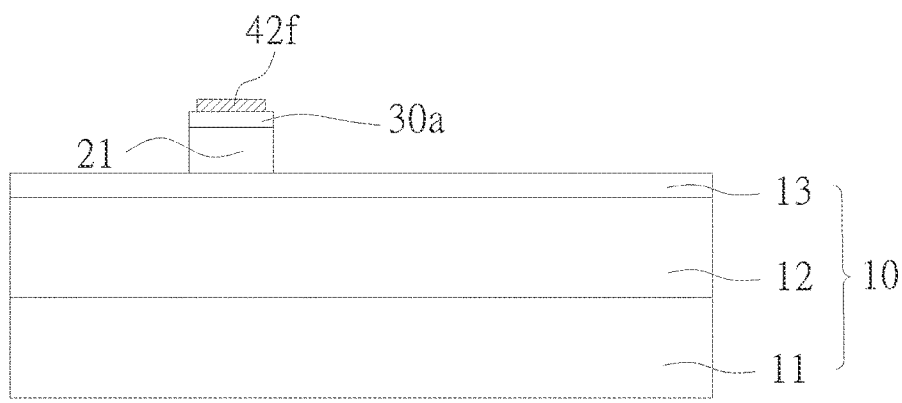

As shown in FIG. 12C, a first metal electrode contact layer 40b is deposited on the passivation layer 30a. The first metal electrode contact layer 40a is a thin layer for protecting the first passivation layer 30a, and the first metal electrode contact layer 40a is a TiN layer in this embodiment. As shown in FIG. 12D, the first metal electrode contact layer 40a, the first passivation layer 30a and the gate layer 20 are etched to define a gate structure 21 and a first metal electrode contact 42f. It is noted that the passivation layer 30a sandwiched between the first metal electrode contact 42f and the gate structure 21 remains intact.

Figure 12E:
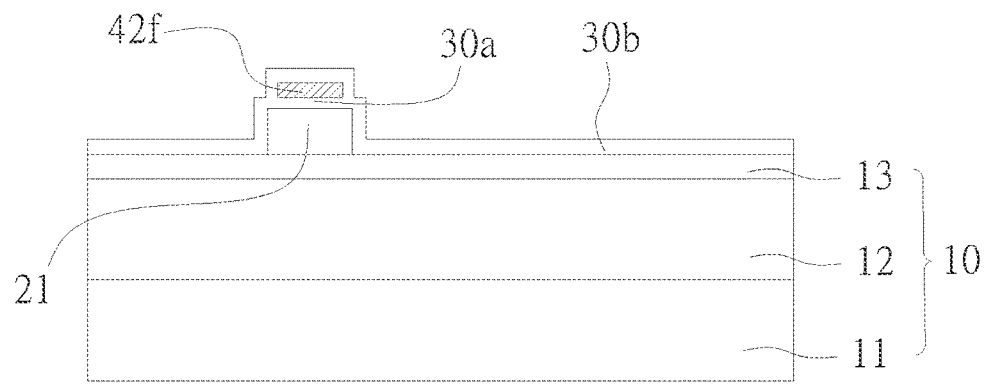

As shown in FIG. 12E, an additional first passivation layer 30b is deposited such that it covers the GaN epi-layer 10, the first metal electrode contact 42f and the gate structure 21. It is noted that the additional first passivation layer 30b shown in FIG. 12E is an additional AlN layer formed by ALD or MOCVD. The additional first passivation layer 30b shown in FIG. 12E can be a high K dielectric material such as an InAlN layer, an AlGaN layer, a $SiO_2$ layer, an $Al_2O_3$ layer, a SiN layer, a $HfO_2$ layer, a $TiO_2$ layer, or a $Ga_2O_3$ layer or a combination of the two of the above-mentioned materials with one material deposited on top of the other one, such as the additional first passivation layer 30b can be a two-layer combination made of a AlN layer situated on a SiN layer.

Figure 12F:
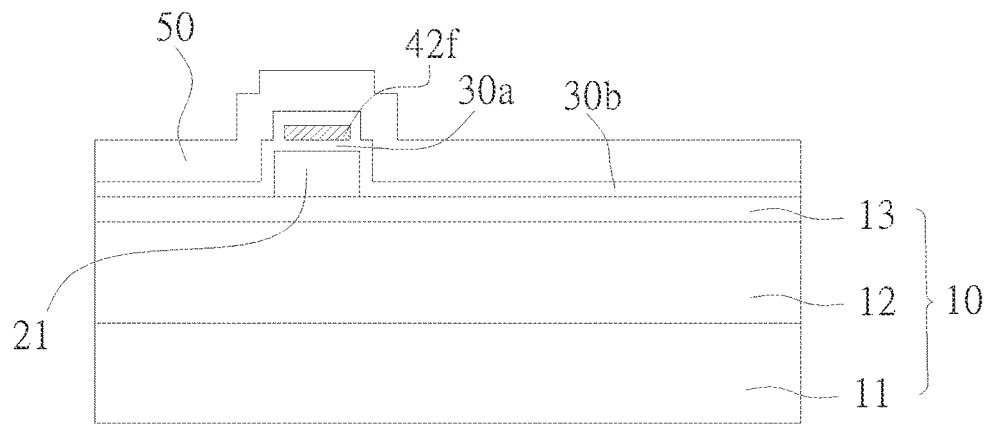
Figure 12G:
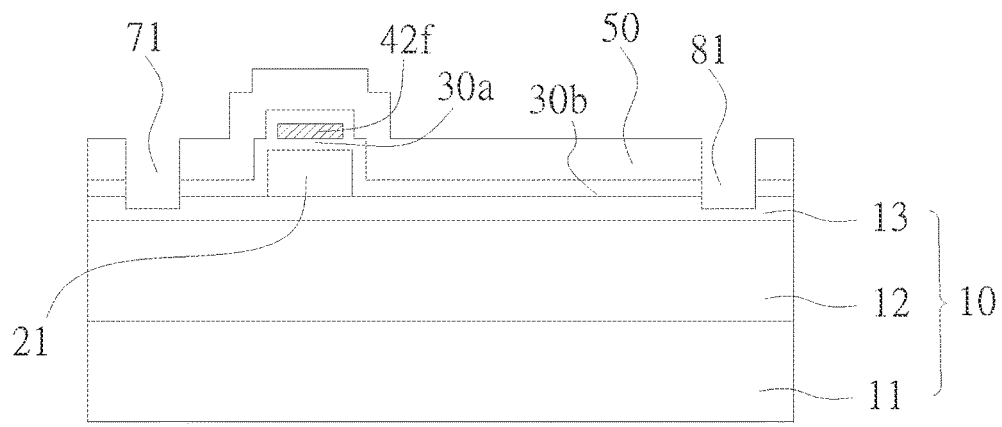
Figure 12H:
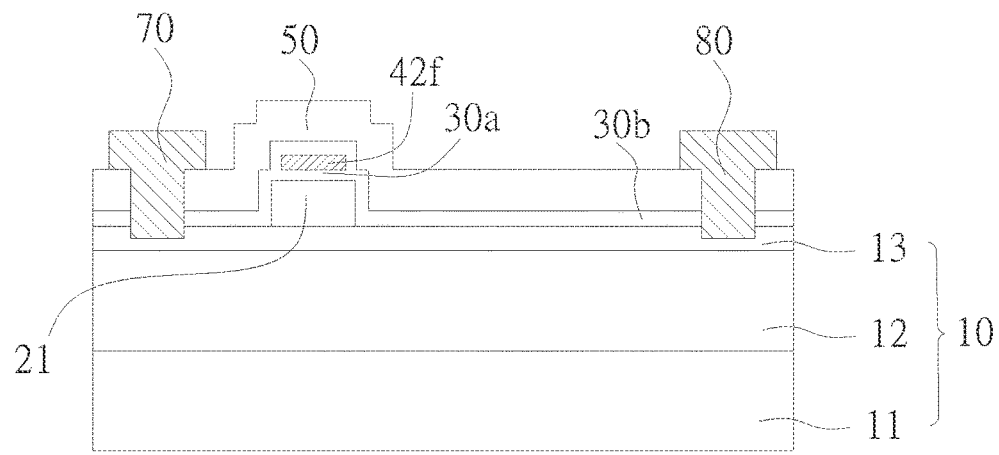

As shown in FIG. 12F, the second passivation layer 50 is a dielectric layer deposited on top of the additional first passivation layer 30b by LPCVD or PECVD, which are different from the depositing method of the additional first passivation layer 30b. As shown in FIG. 12G, the second passivation layer 50, the additional first passivation layer 30b, and the barrier layer 13 are etched to form a source ohmic contact opening 71 and a drain ohmic contact opening 81 on the barrier layer 13. As shown in FIG. 12H, the source ohmic contact 70 and the drain ohmic contact 80 are deposited through the source ohmic contact opening 71 and the drain ohmic contact opening 81 and are formed on the barrier layer 13.

The fifth embodiment of a high electron mobility transistor forming method further includes steps S9a and S10a, and the details for steps S9a and S10a are listed below.

S9a: Etching the second passivation layer and the additional first passivation layer disposed above the gate structure to form a metal electrode contact opening on the first metal electrode contact.

Figure 12I:
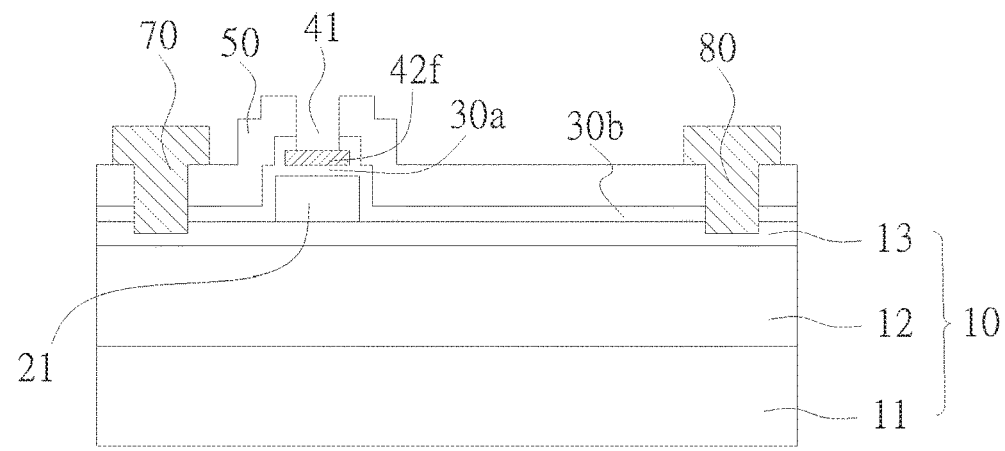

As shown in FIG. 12I, the second passivation layer 50 and the additional first passivation layer 30b are etched, and the etching stops when the first metal electrode contact 42f is reached, to form a metal electrode contact opening 41 on the first metal electrode contact 42f.

S10a: Depositing a second metal electrode contact covering the gate opening.

Figure 12J:
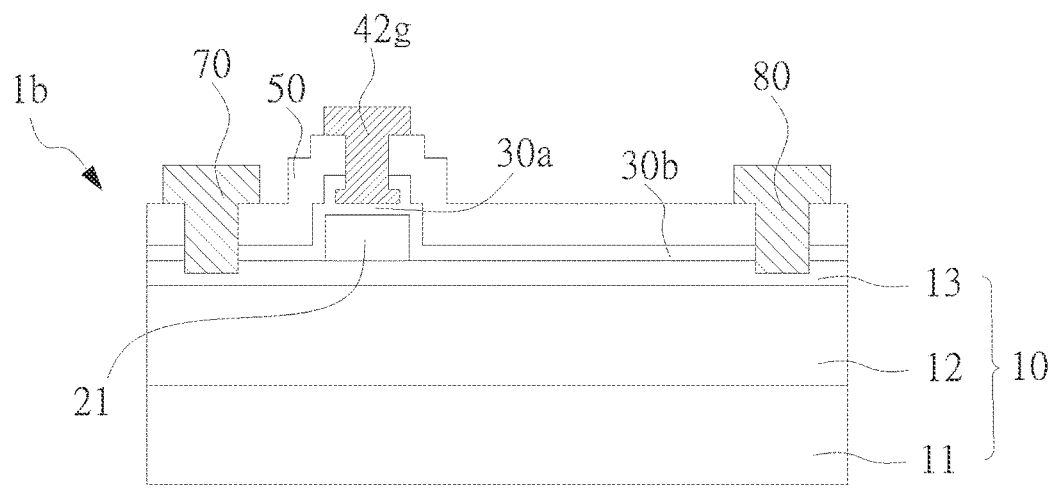

As shown in FIG. 12I and FIG. 12J, the first metal electrode contact 42g is deposited on the first metal electrode contact 42f through the metal electrode contact opening 41 such that the high electron mobility transistor 1b is formed with the first passivation layer 30a sandwiched between the first metal electrode contact 42f and the gate structure 21. It is noted that the thickness of the first passivation layer 30a sandwiched between the first metal electrode contact 42f and the gate structure 21 is less than 10 nm. According to one embodiment of the present disclosure, in the high electron mobility transistor 1b formed by the fifth embodiment of the forming method, the additional first passivation layer 30b disposed on top of the gate structure 21 and the additional first passivation layer 30b on the sidewall of the gate structure 21 can be thicker than the first passivation layer 30a between the gate structure 21 and the first metal electrode contact 42f. However, the present disclosure is not limited to this embodiment, the thickness of the first passivation layer 30a sandwiched between the first metal electrode contact 42f and the gate structure 21 can be thinner than or equal to the thickness of the additional first passivation layer 30b covering the two sidewalls 212, 212a of the gate structure 21.

It should be noted that many of the above-mentioned embodiments are given as examples for description, and the scope of the present invention should be limited to the scope of the following claims and not limited by the above embodiments.

What is claimed is:

1. A high electron mobility transistor (HEMT) forming method comprising:
    forming a gate layer on a GaN epi-layer;
    etching the gate layer to form a gate structure;
    depositing a first passivation layer covering the GaN epi-layer and the gate layer; and
    depositing a first metal electrode contact to sandwich the first passivation layer between the first metal electrode contact and the gate structure,
    wherein no portion of the first metal electrode contact is in direct contact with the gate structure.

2. The method as claimed in claim 1, depositing the first metal electrode contact to sandwich the first passivation layer between the first metal electrode contact and the gate structure, the method further comprising:
    depositing a second passivation layer covering the first passivation layer and the gate structure.

3. The method as claimed in claim 2, further comprising:
    etching the second passivation layer to form a source ohmic contact opening and a drain ohmic contact opening; and
    forming a source ohmic contact and a drain ohmic contact.

4. The method as claimed in claim 2, depositing the first metal electrode contact to sandwich the first passivation layer between the first metal electrode contact and the gate structure, the method further comprising:
    etching the second passivation layer disposed above the gate structure to form a metal electrode contact opening on the first passivation layer; and
    depositing the first metal electrode contact covering the metal electrode contact opening to sandwich the first passivation layer between the first metal electrode contact and the gate structure.

5. The method as claimed in claim 2, depositing a second passivation layer covering the first passivation layer and the gate structure, the method further comprising: depositing the first metal electrode contact on the first passivation layer disposed on the gate structure.

6. The method as claimed in claim 5, further comprising:
    etching the second passivation layer disposed above the gate structure to form a metal electrode contact opening on the first passivation layer, and
    depositing a second metal electrode contact covering the metal electrode contact opening.

7. The method as claimed in claim 6, wherein a thickness of the first metal electrode contact is smaller than a thickness of the second metal electrode contact.

8. The method as claimed in claim 7, wherein the first metal electrode contact is a TiN layer.

* * * * *